United States Patent
Lue

(10) Patent No.: US 9,397,110 B2
(45) Date of Patent: Jul. 19, 2016

(54) 3D INDEPENDENT DOUBLE GATE FLASH MEMORY

(71) Applicant: MACRONIX INTERNATIONAL CO., LTD., Hsinchu (TW)

(72) Inventor: Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 9 days.

(21) Appl. No.: 14/284,306

(22) Filed: May 21, 2014

(65) Prior Publication Data

US 2015/0340369 A1  Nov. 26, 2015

(51) Int. Cl.
| | |
|---|---|
| H01L 29/66 | (2006.01) |
| H01L 29/792 | (2006.01) |
| H01L 27/115 | (2006.01) |
| G11C 16/10 | (2006.01) |
| G11C 16/04 | (2006.01) |

(52) U.S. Cl.
CPC ........ H01L 27/1157 (2013.01); G11C 16/0466 (2013.01); G11C 16/10 (2013.01); H01L 27/11563 (2013.01); H01L 27/11578 (2013.01); H01L 29/66666 (2013.01); H01L 29/66833 (2013.01); H01L 29/792 (2013.01); H01L 29/7926 (2013.01)

(58) Field of Classification Search
CPC .................. H01L 29/66833; H01L 29/66666; H01L 29/792; H01L 29/7926; H01L 27/11563
See application file for complete search history.

(56) References Cited

U.S. PATENT DOCUMENTS

| | | | |
|---|---|---|---|
| 7,714,377 B2 | 5/2010 | Specht et al. | |
| 8,013,383 B2 | 9/2011 | Kidoh et al. | |
| 8,163,616 B2 * | 4/2012 | Kang | H01L 27/115 257/326 |
| 8,203,187 B2 | 6/2012 | Lung et al. | |
| 8,208,279 B2 | 6/2012 | Lue | |
| 8,363,476 B2 | 1/2013 | Lue et al. | |
| 8,437,192 B2 | 5/2013 | Lung et al. | |
| 8,467,219 B2 | 6/2013 | Lue | |
| 8,625,322 B2 | 1/2014 | Samachisa et al. | |

(Continued)

OTHER PUBLICATIONS

Arya, Pranav, "3D Nand Flash Memory," IEE5008 Memory Systems,—Autumn 2012, 43 pages. In accordance with MPEP 609.04 (a), the year of this publication is sufficiently earlier than the effective U.S. filing date, Sep. 24, 2010, so that the particular month of publication is not an issue. See MPEP 609.04 (a).

(Continued)

Primary Examiner — Phat X Cao
(74) Attorney, Agent, or Firm — Haynes Beffel & Wolfeld LLP

(57) ABSTRACT

A memory device configurable for independent double gate cells, storing multiple bits per cell includes multilayer stacks of conductive strips configured as word lines. Active pillars are disposed between pairs of first and second stacks, each active pillar comprising a vertical channel structure, a charge storage layer and an insulating layer. The insulating layer in a frustum of an active pillar contacts a first arcuate edge of a first conductive strip in a layer of the first stack and a second arcuate edge of a second conductive strip in a same layer of the second stack. A plurality of insulating columns serve, with the active pillars, to divide the stacks of word lines into even and odd lines contacting opposing even and odd sides of each active pillar. The active pillar can be generally elliptical with a major axis parallel with the first and second conductive strips.

9 Claims, 24 Drawing Sheets

(56) References Cited

U.S. PATENT DOCUMENTS

| | | | |
|---|---|---|---|
| 8,644,077 B2 | 2/2014 | Lue et al. | |
| 8,681,555 B2 | 3/2014 | Liu | |
| 8,853,818 B2 | 10/2014 | Lue | |
| 8,917,557 B2 | 12/2014 | Sakaguchi et al. | |
| 9,147,468 B1 | 9/2015 | Lue | |
| 2009/0184360 A1 | 7/2009 | Jin et al. | |
| 2010/0020617 A1* | 1/2010 | Oh | G11C 16/0483 365/185.23 |
| 2010/0155818 A1* | 6/2010 | Cho | H01L 27/11578 257/324 |
| 2011/0175157 A1* | 7/2011 | Sekine | H01L 21/28282 257/324 |
| 2011/0298037 A1 | 12/2011 | Choe et al. | |
| 2012/0068241 A1 | 3/2012 | Sakuma et al. | |
| 2012/0182806 A1 | 7/2012 | Chen et al. | |
| 2012/0299086 A1 | 11/2012 | Lee | |
| 2013/0313627 A1* | 11/2013 | Lee | H01L 21/76816 257/324 |
| 2014/0001530 A1* | 1/2014 | Song | H01L 29/78 257/314 |
| 2014/0198570 A1 | 7/2014 | Hsieh et al. | |
| 2014/0231954 A1 | 8/2014 | Lue | |

OTHER PUBLICATIONS

Chen, Chih-Ping, et al., "A Highly Pitch Scalable 3D Vertical Gate (VG) NAND Flash Decoded by a Novel Self-Aligned Independently Controlled Double Gate (IDG) String Select Transistor (SSL)", Jun. 12-14, 2012, 2012 Symposium on VLSI Technology (VLSIT), pp. 91-92.

Choi et al., "3D approaches for non-volatile memory", 2011 Symposium on VLSI Technology, Digest of Technical Papers, pp. 178-179, Jun. 14-16, 2011.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Lai et al., "A Multi-Layer Stackable Thin-Film Transistor (TFT) Nand-Type Flash Memory," Electron Devices Meeting, 2006, IEDM '06 International, Dec. 11-13, 2006, pp. 1-4.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Nowak et al., "Intrinsic fluctuations in Vertical NAND flash memories," 2012 Symposium on VLSI Technology, Digest of Technical Papers, pp. 21-22, Jun. 12-14, 2012.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Wang, Michael, "Technology Trends on 3D-NAND Flash Storage", Impact 2011, Taipei, dated Oct. 20, 2011, found at www.impact.org.tw/2011/Files/NewsFile/201111110190.pdf, 29 pages.

\* cited by examiner

3D INDEPENDENT DOUBLE GATE FLASH MEMORY

BACKGROUND OF THE INVENTION

1. Field of the Invention

The present invention relates to high density memory devices, and particularly to memory devices in which multiple planes of memory cells are arranged to provide a three-dimensional 3D array.

2. Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Another structure that provides vertical NAND cells in a charge trapping memory technology is described in Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009. The structure described in Katsumata et al. includes a vertical NAND gate, using silicon-oxide-nitride-oxide-silicon SONOS charge trapping technology to create a storage site at each gate/vertical channel interface. The memory structure is based on a column of semiconductor material arranged as the vertical channel for the NAND gate, with a lower select gate adjacent the substrate, and an upper select gate on top. A plurality of horizontal word lines is formed using planar word line layers that intersect with the columns, forming a so-called gate all around cell at each layer, as illustrated by FIG. 1.

FIG. 1 is a horizontal cross-section of a column of a pipe-shaped BiCS flash cell, such as described in the Katsumata et al. publication, at the level of a word line. The structure includes a pillar 10 of semiconductor material which extends vertically through a stack of word line layers. The pillar 10 may have a seam 11 through the middle that arises from the deposition technique. A dielectric charge trapping structure comprising for example a first layer 12 of silicon oxide, a layer 13 of silicon nitride and a second layer 14 of silicon oxide (referred to as ONO), or another multilayer dielectric charge trapping structure surrounds the pillar 10. A gate all-around word line is intersected by the pillar. A frustum of the pillar at each layer combines with the gate all-around word line structure at that layer, to form a memory cell.

For the purposes of high density memory devices, it is desirable to have the channel diameter of the pillar 10 as small as possible. However, as the channel diameter shrinks, approaching for example 40 nm or less, the field enhancement factor by which the electric field between the word line 15 and the pillar 10 is intensified at the channel surface, can lead to problems with disturbance of charge trapped in the memory cells during read operations and program operations. As a result, the reliability of the structure degrades.

Katsumata et al. has suggested that the structure can be implemented using multiple-bit-per-cell programming technologies. These multiple-bit-per-cell programming technologies require fine control over threshold voltages, making read and program disturb characteristics even more critical. Therefore, even with high density three-dimensional flash technologies, the density of data storage can be limited.

Because of the relatively large cross-section of the column and dielectric charge trapping structure used to limit disturbance, the density of the three-dimensional memory structure is limited.

It is desirable to provide a structure for three-dimensional integrated circuit memory with a low manufacturing cost, including reliable, very small memory elements, and high data densities.

SUMMARY OF THE INVENTION

A 3D memory device configurable for independent double gate, multiple-bit per cell operation is described. Very high density data storage can be achieved.

A vertical channel 3D NAND array is described, configured for independent double gate operation. Word lines in the each layer of the stack can be shared horizontally and are split into even and odd sides. As a result, a row of independent double gate cells is disposed between each pair of even and odd word lines. String select structures can also be implemented using independent double gate structures at a top layer of the stack, all separated and independently decoded.

The structure can be made using hole-shaped etching, forming holes in which to form the vertical channel structures, and in which to form isolation pillars that divide the word line structures in each layer into the even and odd sides. As can be achieved using the hole-shaped etching, memory cells at each frustum of each active pillar have a first arcuate edge contacting and even word line, and a second arcuate edge contacting and odd word line.

An operating method is described which involves separately programming each side of the memory cell at each frustum of the active pillars in the array. This results in two charge storage sites in each memory cell, each of which can be programmed to hold more than one bit. The structure therefore enables storage of 4 bits per cell or more to achieve very high data density.

A row of a memory array as described herein includes first and second multilayer stacks of conductive strips, such that each layer can include an even and an odd word line. A plurality of active pillars is disposed between the first and second stacks. Each active pillar comprises a vertical channel structure, a charge storage layer and an insulating layer. The insulating layer in a frustum of an active pillar contacts the first arcuate edge of a first conductive strip in the first stack at the layer of the frustum, and contacts the second arcuate edge of a second conductive strip in the second stack at the layer of the frustum. Inter-stack insulating columns are interleaved among the plurality of active pillars between the first and second stacks, separating the even and odd word lines.

The active pillars can have an elliptical or elongated cross-section, with a major axis generally parallel to the conductive strips. As a result, a cross-section of the active pillar in a particular frustum is arranged so the average radius of curvature of the first and second arcuate edges is greater than an average radius of curvature of the frustum adjacent insulating columns in the same layer. This reduces field enhancement in the charge storage structure that could result from a smaller radius of curvature, and improves immunity to disturbance in the memory cells.

Examples are described in which this basic structure is extended into an array forming a very dense memory structure.

Methods for manufacturing memory devices as described herein are also provided.

Other aspects and advantages of the present invention can be seen on review of the drawings, the detailed description and the claims, which follow.

DETAILED DESCRIPTION

A detailed description of embodiments of the present invention is provided with reference to the FIGS. 2-22.

Figure 1:
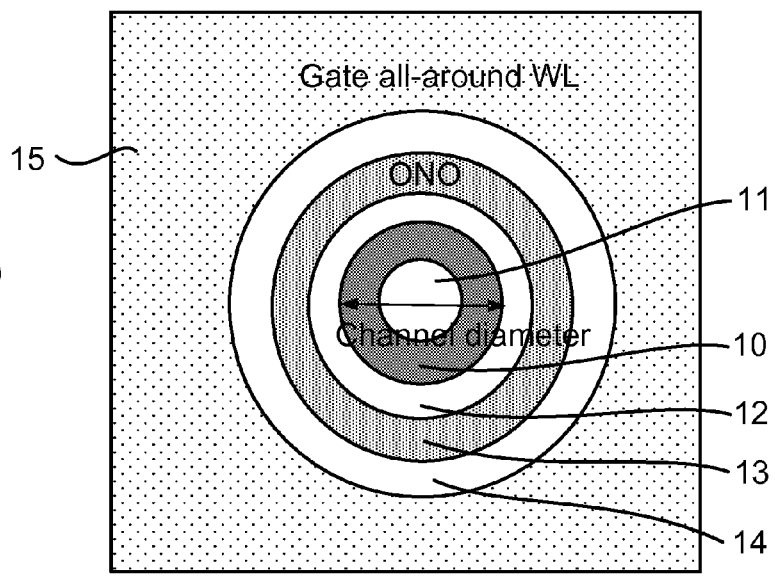
FIG. 1 is a cross-section of a prior art gate all-around memory cell.
Figure 2:
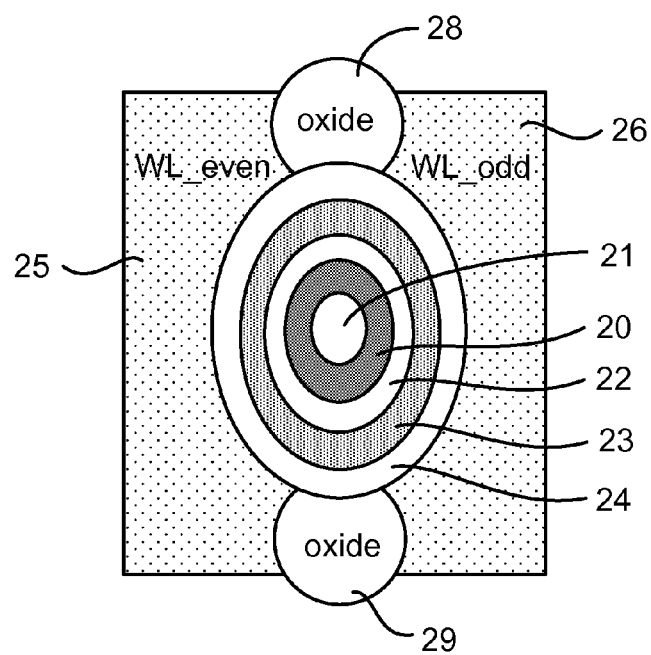
FIG. 2 is a cross-section of an independent double gate flash memory cell for a 3D array as described herein.

FIG. 2 is a horizontal cross-section taken through a column of flash memory cells in a 3D array at a word line level. As illustrated, a vertical channel structure 20 of semiconductor material extends vertically through a stack of word line layers. The vertical channel structure 20 may have a seam 21 through the middle. A multilayer dielectric charge trapping structure comprising for example a first layer 22 of silicon oxide, the layer 13 as silicon nitride, and a second layer 24 of silicon oxide, surrounds the vertical channel structure 20. The columnar structure including the vertical channel structure 20 of semiconductor material, and the multilayer dielectric charge trapping structure surrounding the vertical channel structure 20, can be referred to as an active pillar herein.

An even word line 25 and an odd word line 26 are disposed on opposing sides of the active pillar. Isolation pillars 28 and 29, which can comprise silicon dioxide or other insulating material, are disposed on either side of the active pillar along the word line direction, and separate the even word line 25 from the odd word line 26 as can be seen more clearly in following drawings. The even word line 25 and the odd word line 26 can be coupled to word line driver circuits which are configured to independently operate the word lines.

At a particular word line layer, in combination a frustum of the active pillar, the even word line and the odd word line form an independent, double gate flash memory cell.

The word lines can comprise a variety materials including doped semiconductors, metals, and conductive compounds like Si, Ge, SiGe, SiC, TiN, TaN, W, and Pt. The vertical semiconductor channel is a part of the active pillar in the memory device, and can comprise semiconductor materials adapted to act as channels for the memory cells, including such materials as Si, Ge, SiGE, GaAs, SiC, and graphene. Charge storage structures in the memory device, can comprise multilayer dielectric charge trapping structures known from flash memory technologies, such as SONOS, BE-SONOS, TANOS, and MA BE-SONOS and so on.

Figure 3:
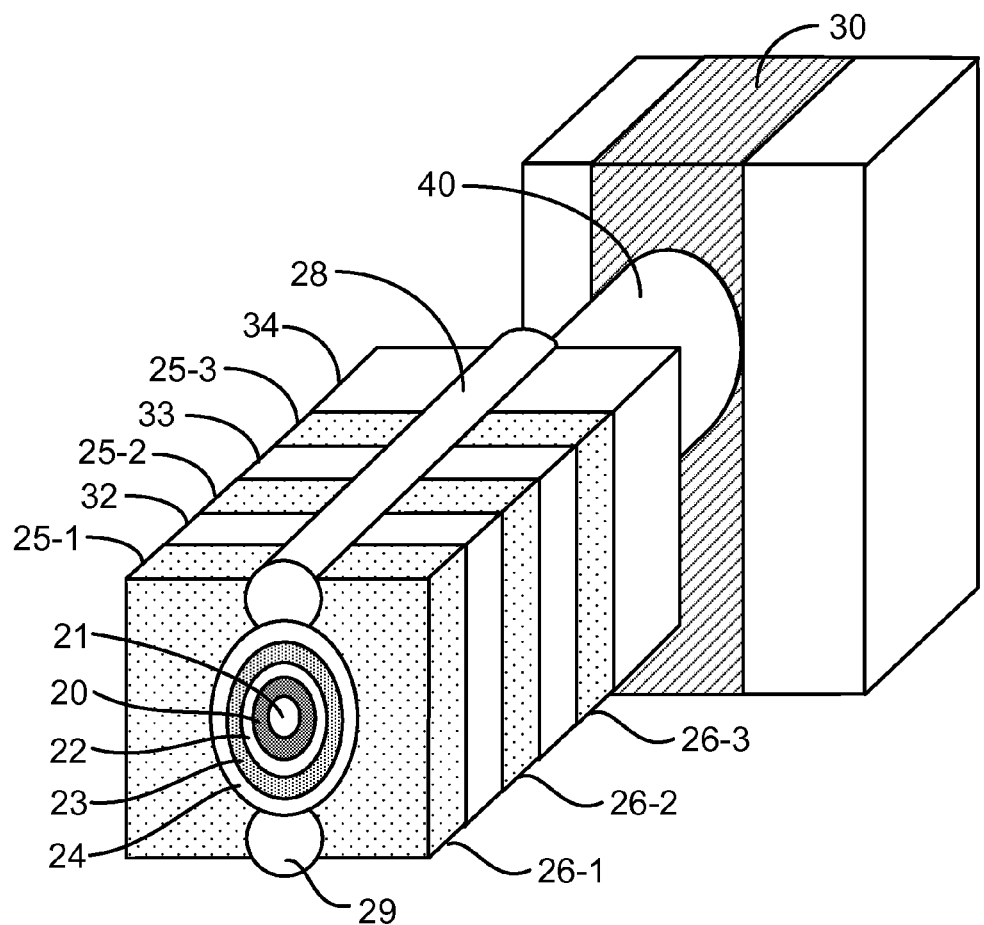
FIG. 3 is a perspective view of a single column of independent double gate flash memory cells as described herein.

FIG. 3 provides a perspective view of a single active pillar 40, with other elements of the array removed. As can be seen, the active pillar 40 extends out of a source line conductor structure 30, through the word line layers. The source line conductor structure 30 can be implemented in a variety of ways, and may include a switch such as a ground select line GSL switch. The source line conductor structure 30 provides a current path to a source side bias voltage circuit for the string of memory cells in the active pillar.

Each of the word line layers is separated from overlying layers by insulators 33, 32. An insulating layer 34 isolates the lowest word line layer from the underlying source line conductor structure 30. Each of the word line layers adjacent the vertical channel structure 40 includes an even word line 25-1, 25-2, 25-3 and odd word line 26-1, 26-2, 26-3. The isolation pillars 28, 29 are disposed along the sides of the active pillar 40 and divide the even and odd word lines.

Figure 4:
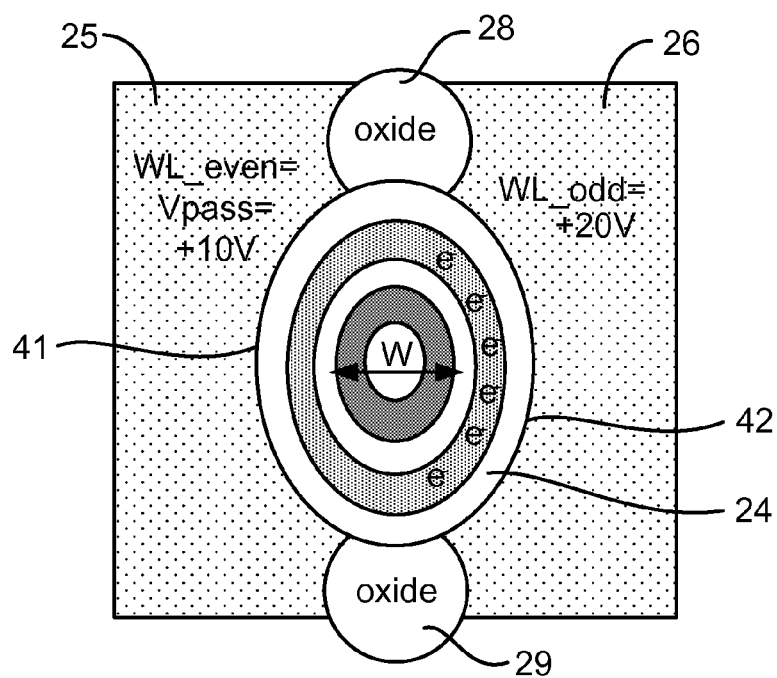
FIG. 4 illustrates an independent double gate flash memory cell with charge storage on one side.

FIG. 4 is a horizontal cross-section taken through a column of a flash memory cell, like FIG. 2. Reference is made to FIG. 4 to describe various features of the independent, double gate memory cell described herein. Reference numerals used in FIG. 2 are applied in FIG. 4 and not described again. The active pillar, including the pipe-shaped vertical channel structure 20, and the surrounding dielectric charge storage layers 22, 23, 24, in cross-section form an elliptical shape in the illustrated embodiment, such that the shape can be considered to have a major axis and a minor axis, without necessarily forming an ellipse as strictly defined. The major axis in some embodiments is substantially longer than the minor axis. In this context, "substantially longer" means longer enough, such as about 7/6 times as long in illustrated examples, that the field enhancement between the vertical channel structure in an active pillar and the conductive word line strip is reduced relative to a circular cross-section by an amount that can appreciably reduce read disturbance.

In the embodiment shown in FIG. 4, an outside surface of the active pillar, which is the outside surface of silicon oxide layer 24 in this example, contacts the even word line 25 along a first arcuate edge 41, and contacts the odd word line 26 along a second arcuate edge 42. The average radius of curvature of the first and second arcuate edges 41, 42 can be greater than the average radius of curvature of the active pillar 40 adjacent the insulating columns 28, 29. This increased average radius of curvature can substantially reduce field enhancement between the word lines and the column of semiconductor material, and improve read and program disturb performance significantly for the device.

As illustrated, the major axis of the elliptical shape cross-section of the active pillar is generally parallel to the even and odd word lines 25, 26. As result, the width W of the cross-section of the vertical channel structure 20 taken on the minor axis of the elliptical shape can be less than the length of the cross-section of the vertical channel structure 20 taken along the major axis of the elliptical shape. This can result in a smaller pitch for the even and odd word line structures.

Embodiments of the independent double gate memory structure can comprise active pillars having cross-sections that are square, rectangular, circular and/or other shapes at one or more of the word line layers.

Figure 5A:
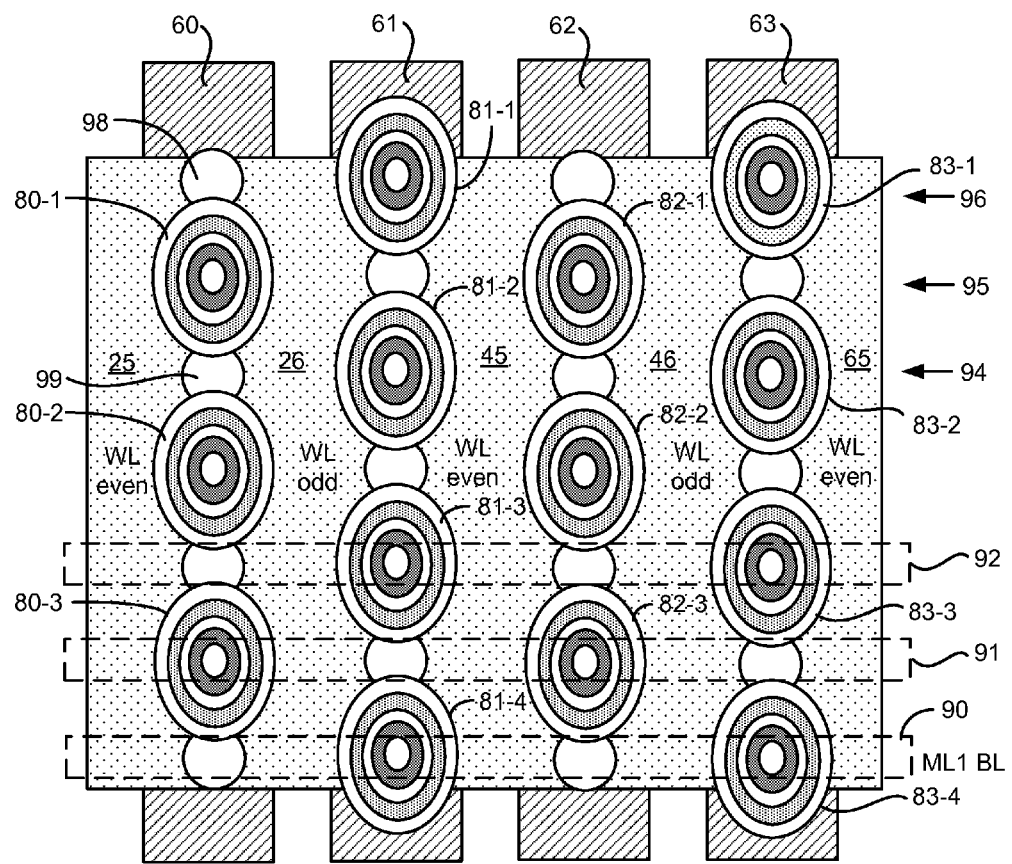
FIGS. 5A and 5B provide a layout and perspective view of an array of independent double gate flash memory cells as described herein.
Figure 5B:
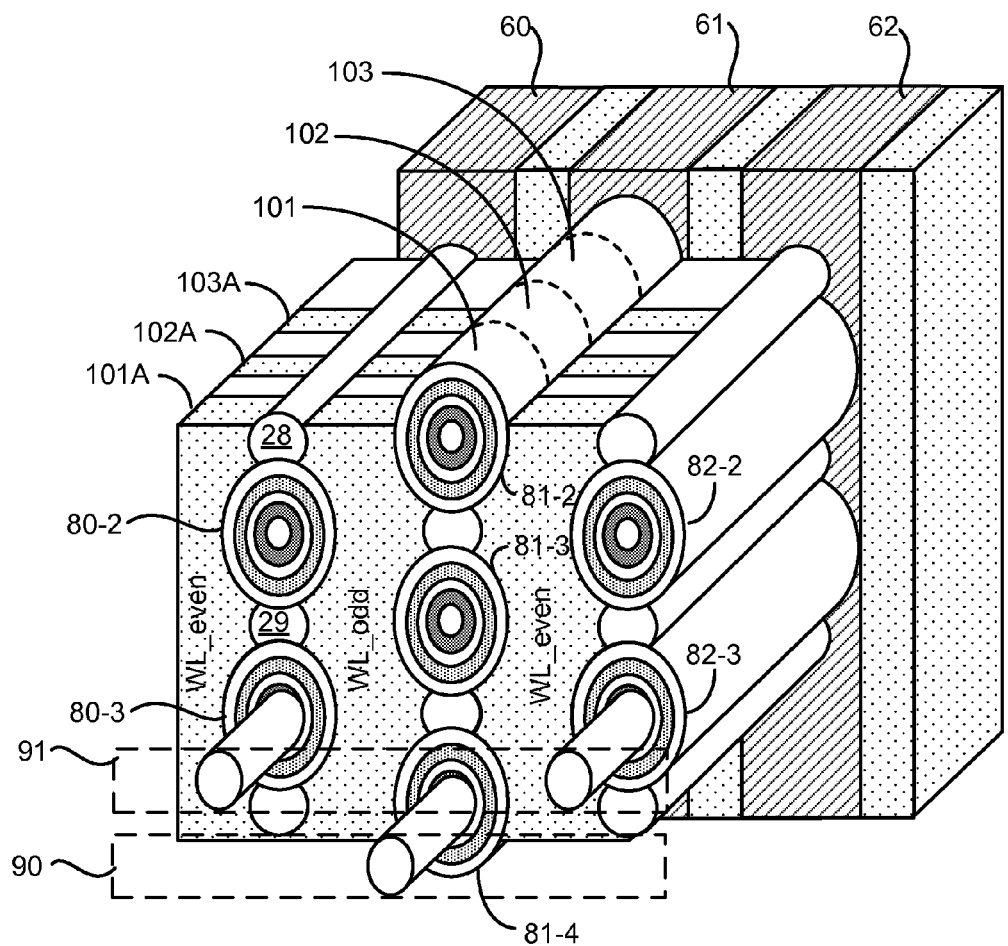

FIGS. 5A and 5B illustrate a layout and perspective view of a 3D block including a plurality of active pillars. In FIG. 5A, a layout view is provided that includes 4 rows (where a row is considered the word line direction for the purposes of array layout) and 7 columns (where a column is considered the global bit line direction for the purposes of array layout), of active pillars arranged in a honeycomb pattern which allows for dense packing of the active pillars. FIG. 5B provides a perspective view of a block including 3 rows and 5 columns of active pillars. Referring to FIG. 5A, each of the rows of active pillars overlies a source line conductor structure 60, 61, 62, 63, examples of which are described below. The source line conductor structures can be disposed on a substrate such as on an insulated layer over a semiconductor chip. Thus, a first row of active pillars includes columns 80-1, 80-2, and 80-3. A second row includes active pillars 81-1, 81-2, 81-3, and 81-4. A third row includes active pillars 82-1, 82-2 and 82-3. A fourth row includes active pillars 83-1, 83-2, 83-3 and 83-4. The active pillars in the rows are offset as illustrated to form a honeycomb pattern. Conductive strips configured as even and odd word lines 25, 26, 45, 46, 65, in each layer are disposed between the rows as illustrated.

The array columns of active pillars are interconnected by overlying metal bit lines 90, 91, 92 as illustrated. Overlying metal bit lines also would be disposed along the array columns 94, 95 and 96, but are not illustrated in the diagram. As illustrated, even and odd word lines are isolated from one another by the active pillars and the isolation pillars (e.g. isolation pillars 98 and 99), allowing for independent double gate operation.

Referring to FIG. 5B, the perspective view of an array structure is illustrated. The array overlies a set of source line conductor structures 60, 61, 62. The array includes active pillars 80-2 and 80-3 in a first row over the source line conductor structure 60, active pillars 81-2, 81-3 and 81-4 in a second row over the source line conductor structure 61, and active pillars 82-2 and 82-3 in a third row over the source line conductor structure 62. Overlying metal bit lines 90 and 91 are connected to the active pillars 81-4 and 80-3 and 82-3 as illustrated in corresponding array columns. For the purposes of illustration, the active pillar 81-2 is schematically divided into a frustum 101 at which it intersects with the top word line layer 101A, a frustum 102 at which it intersects with even and odd word lines in the intermediate word line layer 102A, and a frustum 103 at which it intersects with even and odd word lines in the lower word line layer 103A. As discussed above, an independent double gate memory cell is established by the structure at each of the frustums 101, 102, 103 along the active pillar 81-2. Each of the active pillars can be described with respect to the frustums of the pillar in which memory cells are established.

Active pillars described above can be configured as NAND strings, with string select switches and ground select switches disposed on each end of the active pillars. The string select switches and ground select switches are not discussed above for the purposes of simplifying the description.

FIGS. 6-12 illustrate stages in the manufacturing process for a memory block and are described with reference to FIGS. 5A and 5B.

Figure 6:
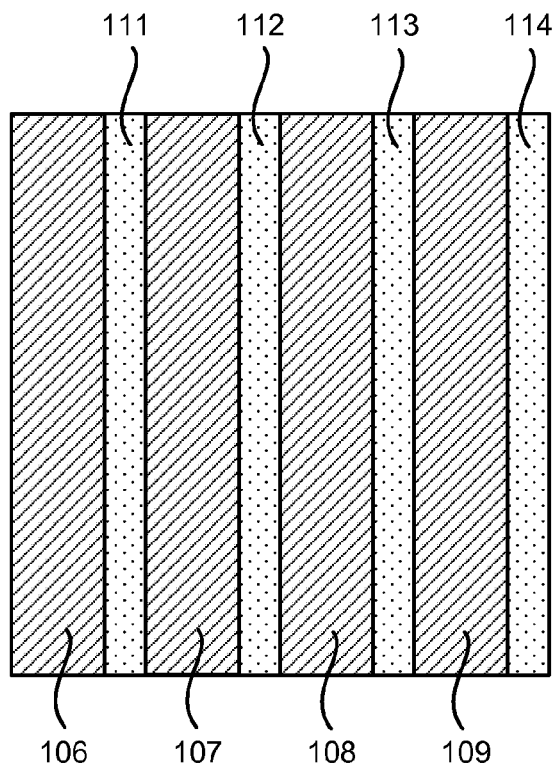
FIGS. 6, 7, 8A, 8B, 9A, 9B, 10, 11A, 11B, 11C, and 12 illustrate stages of the manufacturing process for a structure as illustrated in FIGS. 5A-5B.
Figure 7:
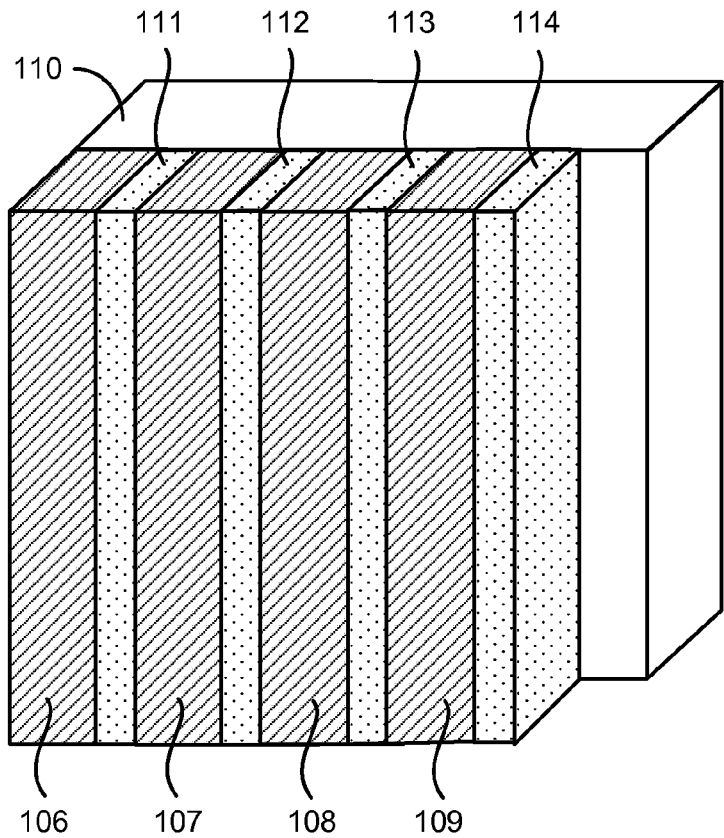

FIGS. 6 and 7 illustrate a pattern for a source line structure formed on an insulating layer 110 (FIG. 7) on a substrate, not shown. The process of manufacturing can begin by forming an insulating layer on a substrate, and then depositing a layer of conductive material such as polysilicon or other conductor which is suitable for use as a ground select line GSL on a NAND string in the 3D structure. The layer is then patterned to define ground select lines 111, 112, 113, 114 on the insulating substrate 110. Trenches between the ground select lines are filled with a sacrificial material such as silicon nitride, or other material which can be removed in subsequent process steps described below. This sacrificial material provides forms 106, 107, 108, 109 between the ground select lines, in which conductive elements of the source line structures are formed along the rows of the array.

Figure 8A:
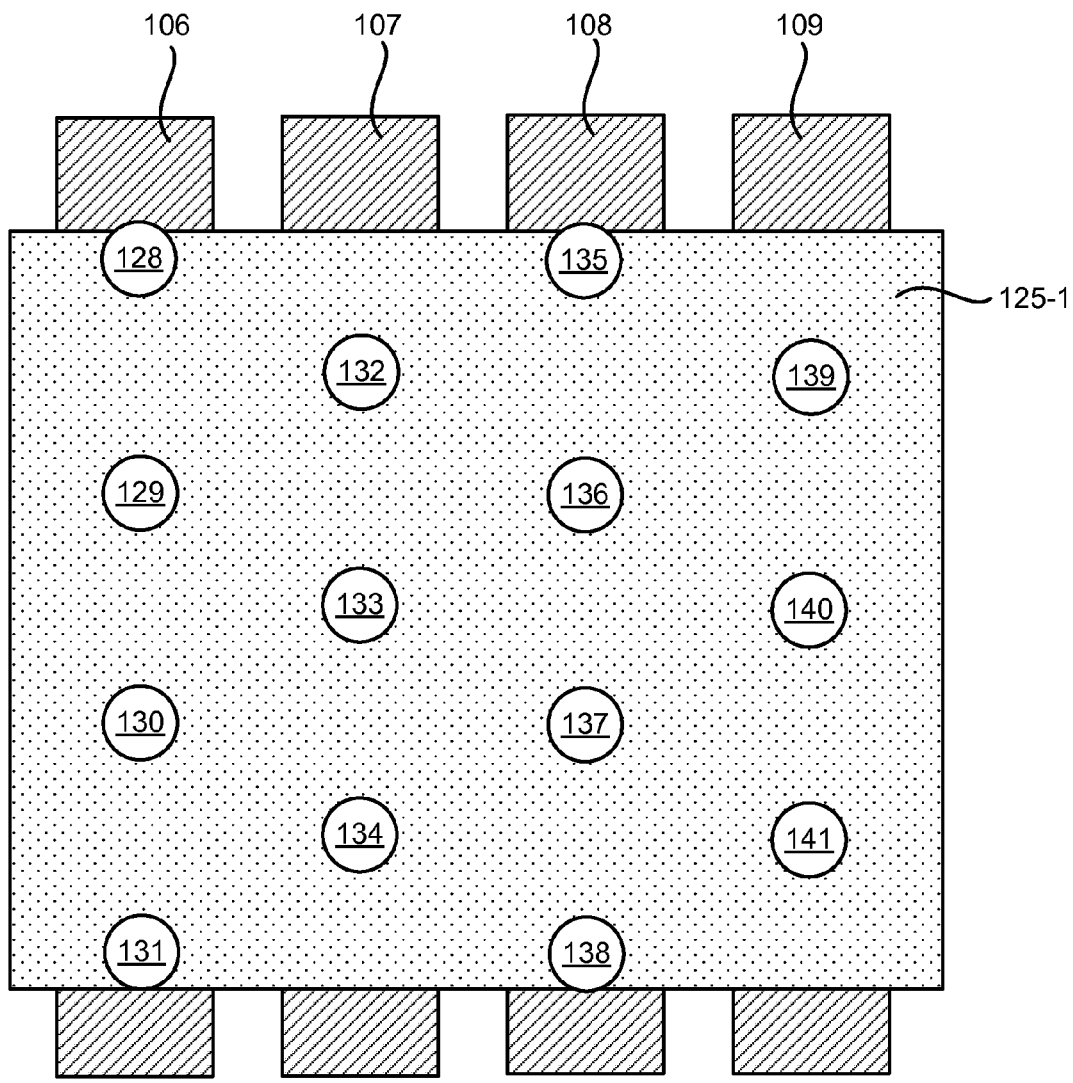
Figure 8B:
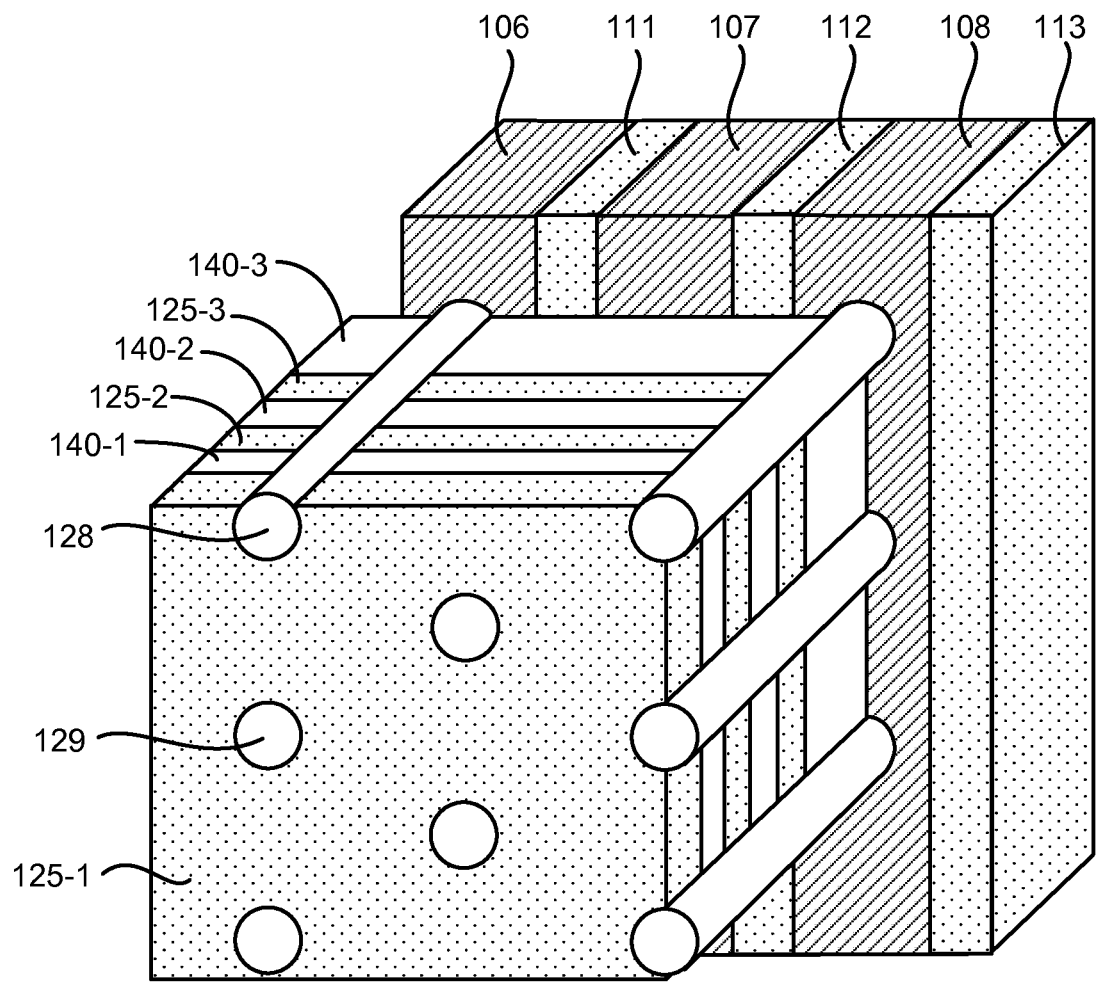

FIGS. 8A and 8B illustrate the structure after another set of manufacturing steps. Manufacturing steps include forming a stack of alternating word line material and insulating material over the ground select lines 111-114 and forms 106-109, and then etching holes, and filling the holes with insulation material to form isolation pillars 128-141 which are arranged in array rows along the forms 106, 107, 108, 109 and along the array columns. FIG. 8A is a layout view of a portion of the array block, without showing connections of the word lines. In NAND string embodiments, a top word line layer can be used to form string select lines. More complete word line layer and string select line layouts are illustrated below with respect to FIGS. 13 and 14.

As can be seen in FIG. 8B, the stack of word line layers includes the top layer 125-1, an intermediate layer 125-2, and a bottom layer 125-3. Insulating layers 140-1, 140-2, 140-3 separate the word line layers. In a representative embodiment, there may be many more word line layers. The isolation pillars (e.g. 128, 129) extend through the stack of word line layers to or partially into the sacrificial forms 106, 107, 108. Insulating holes are etched, and then filled with an insulator such as silicon dioxide or other suitable insulator, which serves, along with active pillars in the array, to separate the word line layers into independent word lines.

The hole etching process can be conducted using a hard mask process. For example, the hole pattern can be created using a photoresist and photo exposure using immersion 193 nm lithography tools, over a dielectric film overlying the carbon hard mask film. The photoresist pattern is then transferred onto the dielectric film by etching. The dielectric film will serve as the hard mask for opening the sacrificial carbon hard mask, and the sacrificial carbon hard mask will be used to open the holes in the stack both in the region.

The etching can be done using a plasma etch recipe, which has equal etching rate (or close to equal) for the memory material, such as the silicon oxide and silicon nitride of the dielectric charge trapping structure in this example, and for conductor material (polysilicon in this example). This can be done for example by using the combination of NF3, CH2F2, HBr, O2, CH4, and He.

Figure 9A:
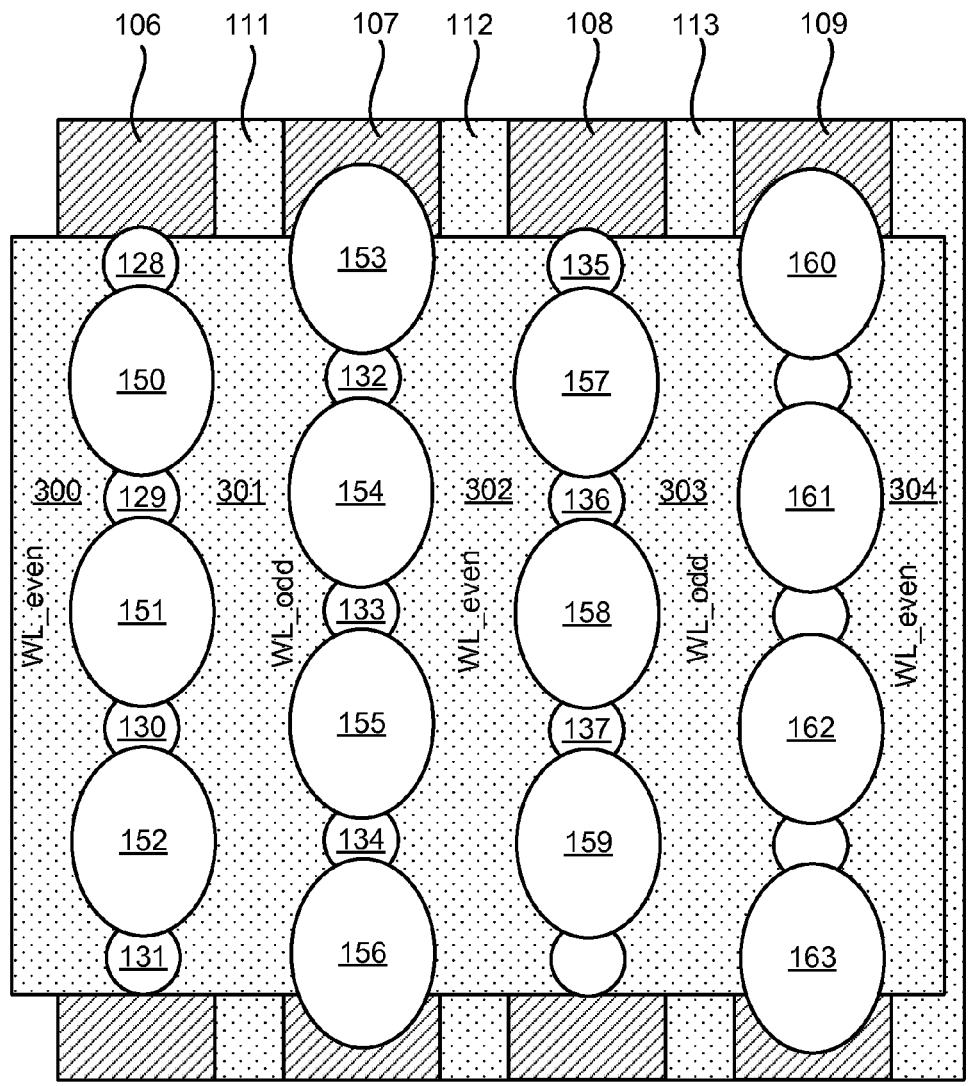
Figure 9B:
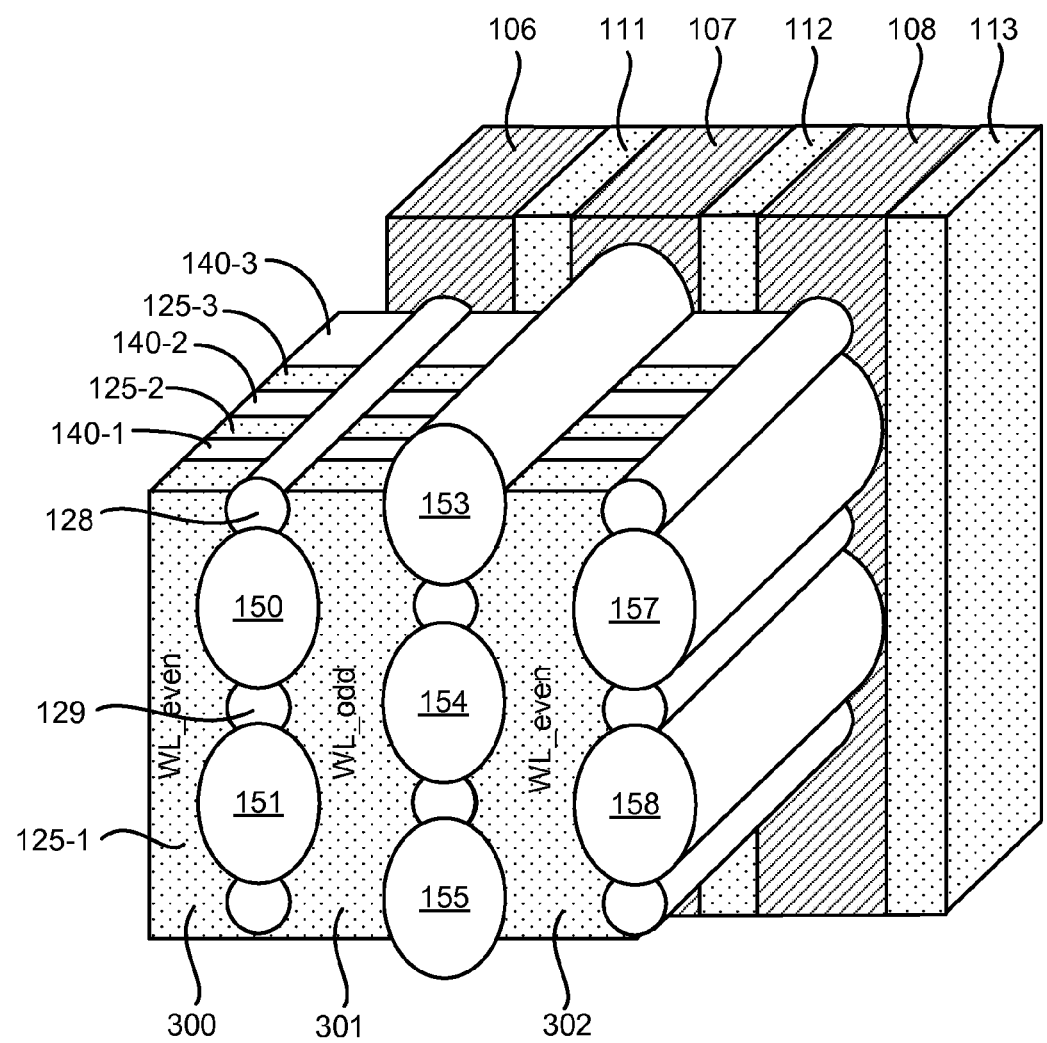

FIGS. 9A and 9B illustrate the structure after yet another set of manufacturing steps. The manufacturing steps include forming an array of elliptical holes 150-163 interleaved with the isolation pillars 128-141 along the array rows and array columns as shown. After forming the elliptical holes 150-163, the word line layers in the stack are separated into even word lines 300, 302, 304, . . . , and odd word lines 301, 303 . . . . As can be seen in FIG. 9B, the elliptical holes extend through the word line layers to or partially into the sacrificial forms 106, 107, 108. The hole etching can be executed using a process as mentioned above. Using an elliptical shape provides a larger process window for the hole etching process, and results in a structure as discussed above which can have improved characteristics. The elliptical shape holes overlap with the isolation pillars so that the word line layers are separated. The etching process can stop inside the sacrificial forms 106, 107, 108. To reduce the likelihood of bridges between the even and odd word lines, such as may result if the hole taper causes the elliptical shape hole not to overlap with the isolation pillar in lower layers of the stack, the length of the elliptical shape can be increased. Also, before filling the isolation pillars with insulation material, one could perform an oxidation step that can consume silicon in the layers around the periphery of the isolation pillars.

Also, as can be seen, the layout is "twisted" so that it is arranged in a honeycomb structure, in order to give a high density, and a small pitch for the overlying bit lines along the array columns as described below.

Figure 10:
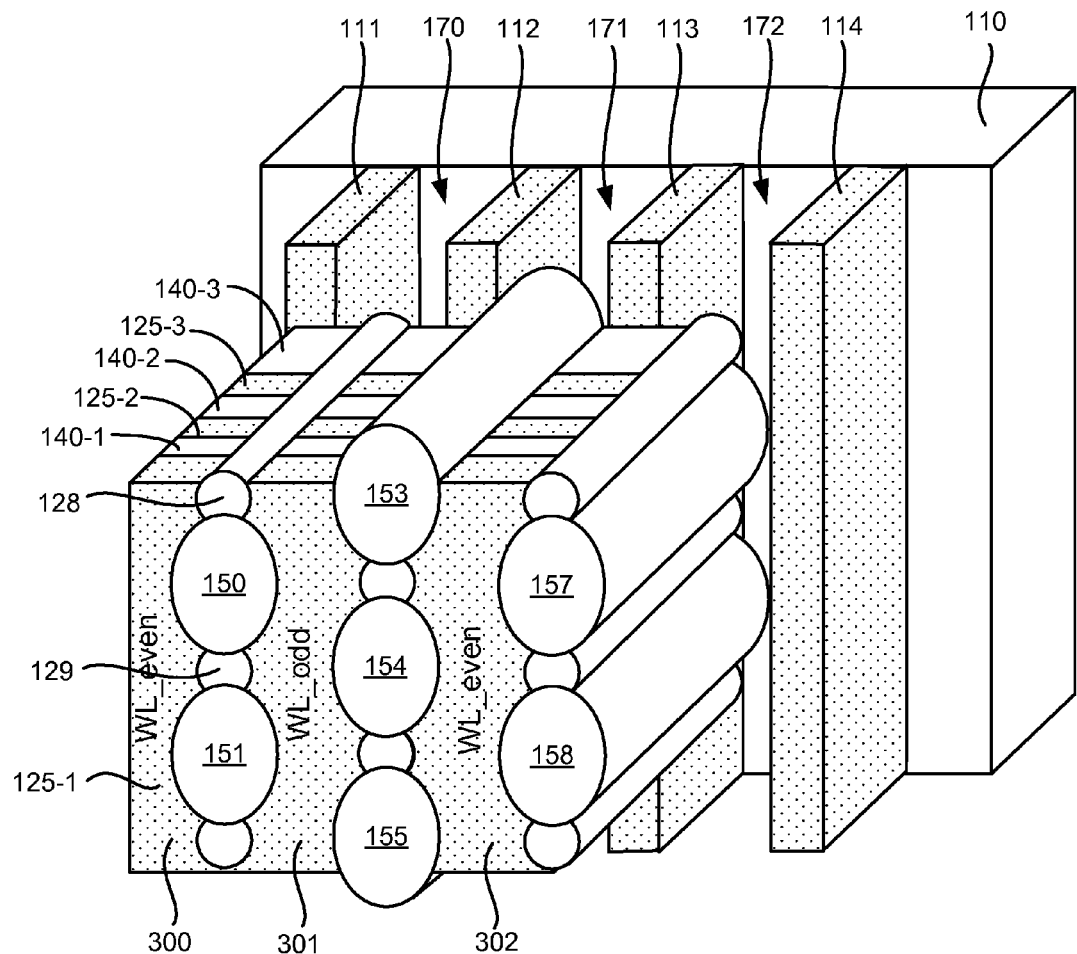

FIG. 10 is a perspective view of the structure after an etching process used to remove the sacrificial forms 106, 107, 108, 109. This results in formation of trench-like voids 170, 171, 172 between the ground select line conductors 111, 112, 113, 114. The etching can be executed using a hot phosphoric acid solution when the sacrificial material as silicon nitride, or other etch recipe which can effectively remove the sacrificial material from within the voids. The holes for the active pillars are now suspended in the structure. However, the structures are easily supported by the surrounding word line structures and isolation pillars. Also, the bottom gate select line structures help sustain the hole structure.

Figure 11A:
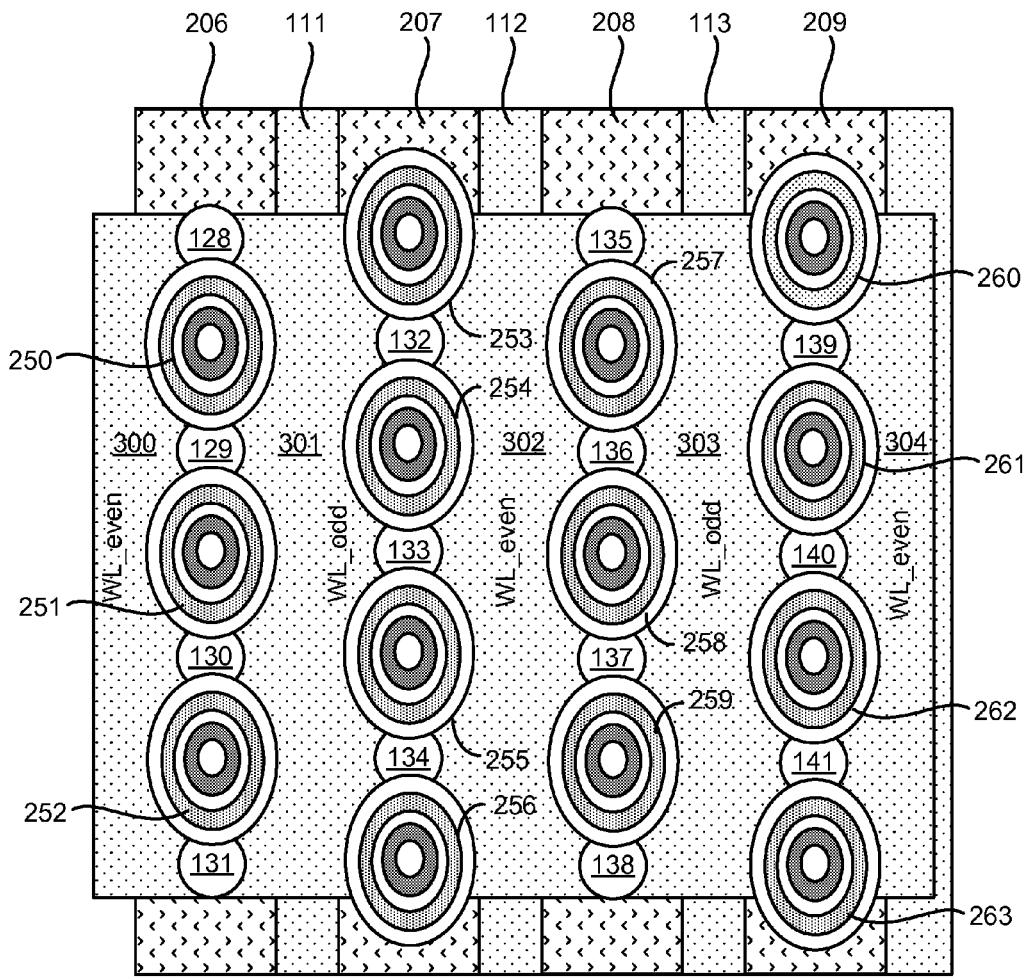
Figure 11B:
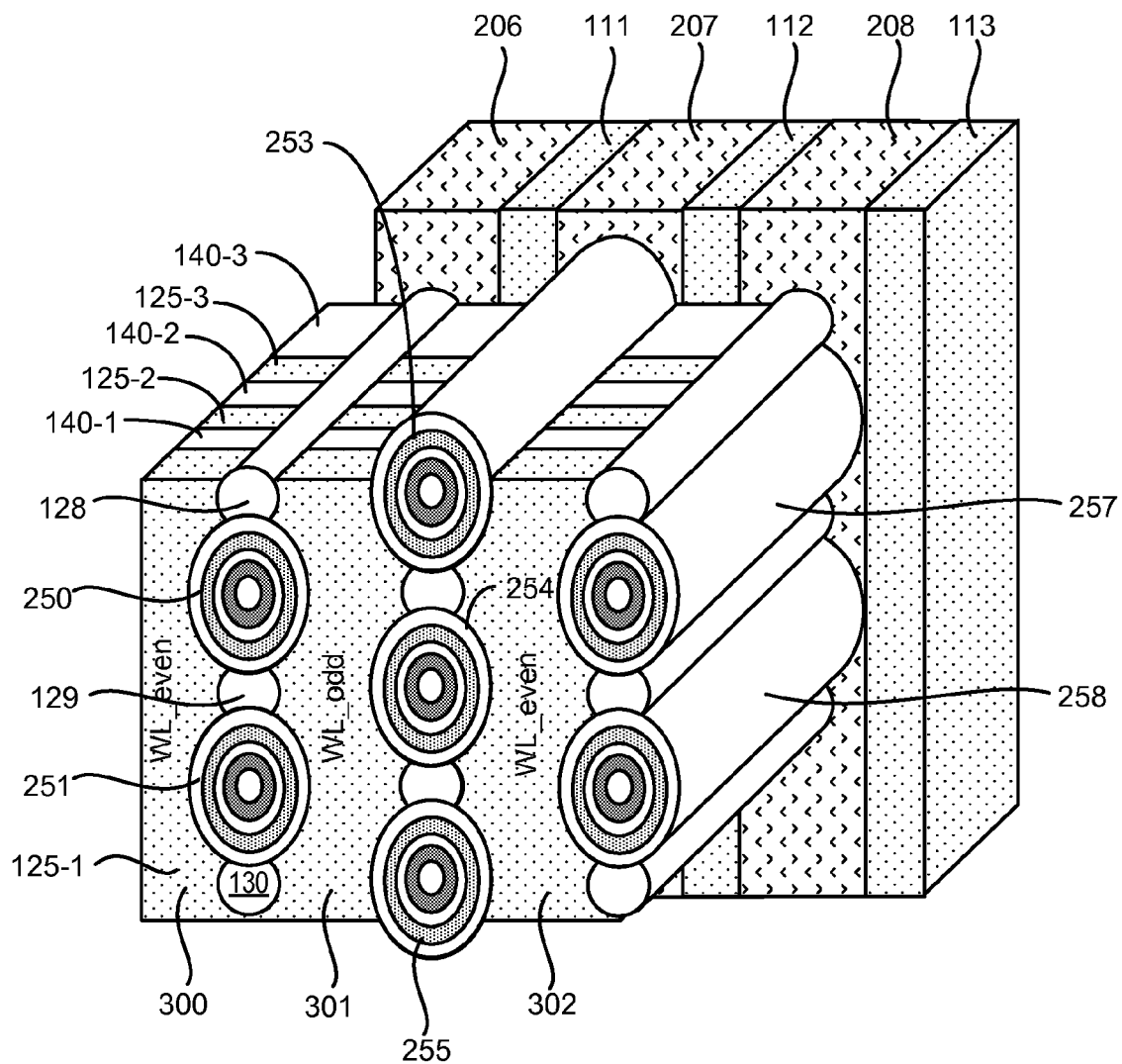
Figure 11C:
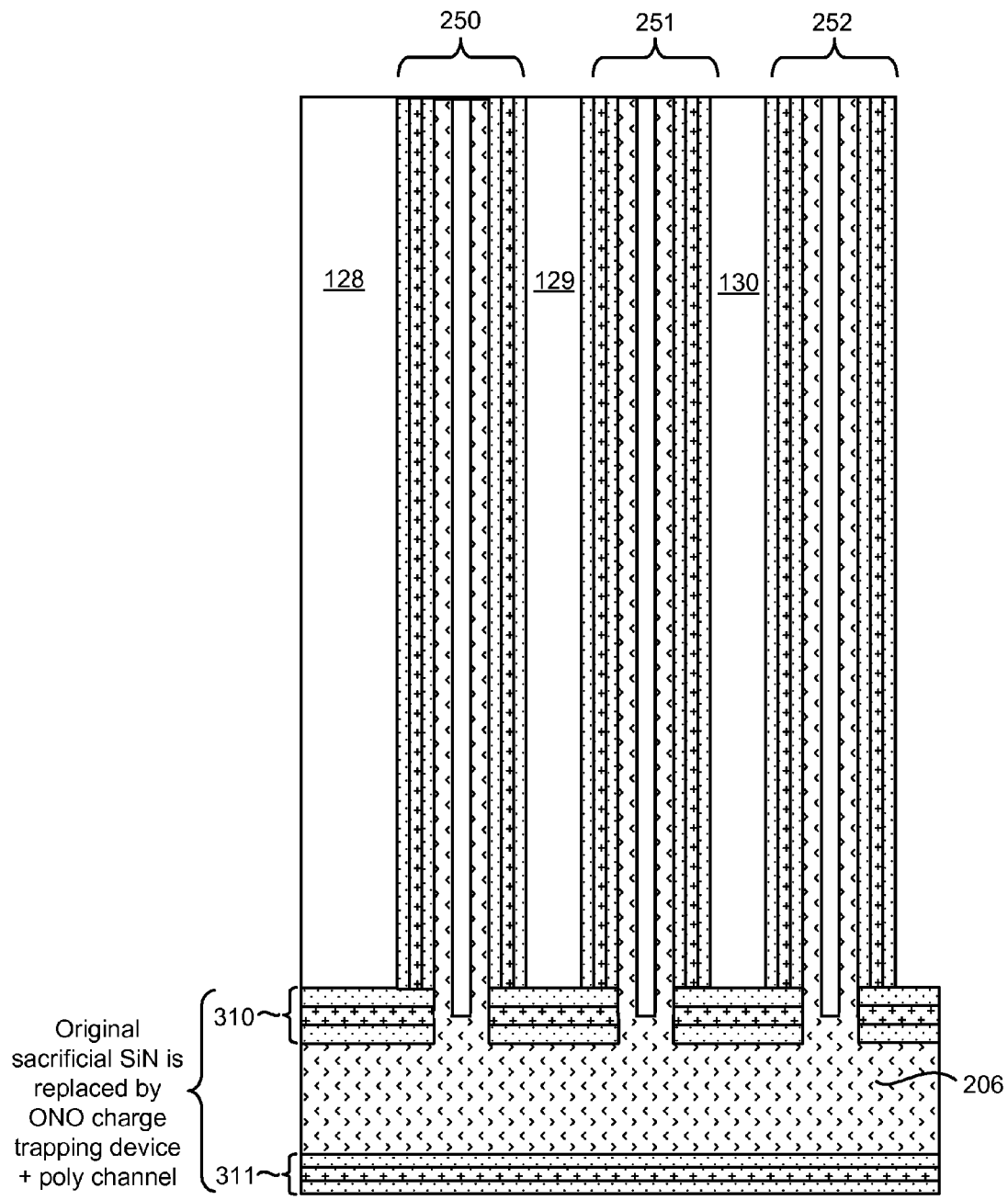

FIGS. 11A-11C illustrate the structure after further manufacturing steps. In particular, manufacturing steps are applied on the structure of FIG. 10 that include conformal deposition of the silicon oxide, silicon nitride, silicon oxide layers which form the dielectric charge trapping structure, followed by conformal deposition of the vertical channel structure using material such as silicon, which in combination result in a "macaroni" style active pillars 250-263, or an active pillars including a vertical channel structure with a seam which results from the conformal deposition of materials. In a representative device, the layer 115 of memory material can include a bandgap engineered composite tunneling dielectric layer comprising a layer of silicon dioxide less than 2 nm thick, a layer of silicon nitride less than 3 nm thick, and a layer of silicon dioxide less that 4 nm thick. In one embodiment, the composite tunneling dielectric layer consists of an ultrathin silicon oxide layer O1 (e.g. <=15 Å), an ultrathin silicon nitride layer N1 (e.g. <=30 Å) and an ultrathin silicon oxide layer O2 (e.g. <=35 Å), which results in an increase in the valence band energy level of about 2.6 eV at an offset 15 Å or less from the interface with the semiconductor body. The $O_2$ layer separates the N1 layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the O2 layer does not significantly interfere with the electric field assisted hole tunneling, while improving the ability of the engineered tunneling dielectric to block leakage during low fields. These layers can be conformally deposited using for example LPCVD A charge trapping layer in the layer 115 of memory material in this embodiment comprises silicon nitride having a thickness greater than 50 Å, including for example about 70 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on.

The blocking dielectric layer in the layer 115 of memory material in this embodiment comprises a layer of silicon dioxide having a thickness greater than 50 Å, including for example about 90 Å in this embodiment, and can be formed by LPCVD or other wet conversion from the nitride by a wet furnace oxidation process. Other blocking dielectrics can include high-K materials like aluminum oxide.

The deposition techniques applied to form these layers of BE-SONOS ONO films and channel material can be simply carried out by conventional LPCVD process, which provides excellent film quality and conformality required. On the other hand, tools such as atomic layer deposition ALD tools can be developed for these films.

In the deposition of the layers which form the dielectric charge trapping structure and the vertical channel structure, the voids 170, 171, 172 are also filled, resulting in a structure lining the voids with the dielectric layers of the dielectric charge trapping structure and filling them, or partially filling them, with a semiconductor layer that is also used to form a vertical channel structure. This results in a source line structure schematically represented by the regions 206, 207, 208, 209 which provides a current pathway from the top of active pillars through the source line structure and up an adjacent active pillar, or up an another active pillar that shares the source line conductor structure, for a "U-shaped" current path in the memory structure.

FIG. 11C illustrates a cross-sectional structure taken along the array row that includes active pillars 250, 251, 252, which are separated by isolation pillars 128, 129, 130. The source line structure 206 is lined by the dielectric charge trapping material 320, 321, and filled with the semiconductor material of the vertical channels. Each of the vertical channel structures includes a seam in this example which can provide for improved isolation between the independent double gate sides of each cell.

After deposition of these materials, the top of the block can be planarized, using chemical mechanical polishing for example, to isolate the vertical channel structures on the top of the stack.

Figure 12:
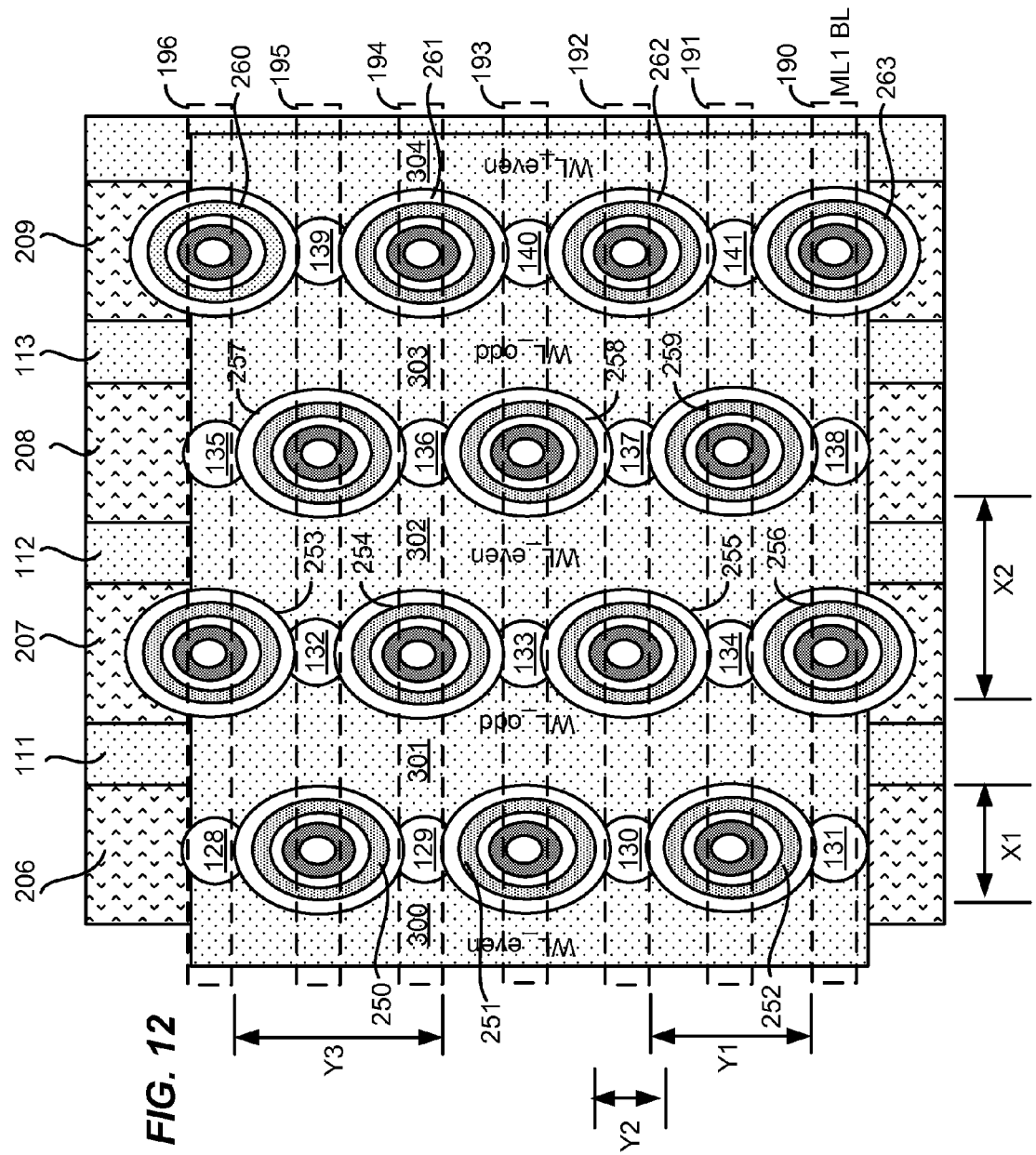

FIG. 12 illustrates the structure after following manufacturing steps, which include formation of an interlayer dielectric over the top of the stacks, interlayer connectors (not shown) and a patterned metal layer that includes bit lines 190-196 which contact the active pillars in each of the array columns.

Referring to FIG. 12, a representative design rule for the layout dimensions of a block of memory cells in the array area can be described. In the illustration, the major axis of the elliptical active pillars is considered the Y dimension, and the minor axis of the elliptical active pillars is considered the X dimension. Thus, the active pillars have a Y pitch, Y1, which can be on the order of 70 nm. Likewise, the isolation pillars have a Y pitch, Y2, which can also be on the order of 70 nm (drawing of the scale). The layout pitch of the active pillars and the isolation pillars can overlap at the patterned mask layer, because of the tapered structures, so that the Y pitch, Y3, active pillar/isolation pillar cells can be about 120 nm, for a half pitch of about 60 nm. As a result of a half pitch in the Y dimension of about 60 nm long in a single row, the pitch of the overlying metal bit lines can be about 30 nm in the honeycomb layout structure illustrated.

In the X dimension, the pitch X1 of the isolation pillar in the pitch X1 of the active pillar can be about 60 nm each. In other embodiments, these values may vary. The X pitch of the active/pillar, word line combination can be about 120 nm as well, for a half pitch of 60 nm.

The minimum X pitch on the minor axis of the elliptical active pillar needs to accommodate the thickness of the dielectric charge trapping layers, and a minimum diameter of the vertical channel structure. Assuming that the dielectric charge trapping structure has a maximum thickness of about 20 nm, and the vertical channel structure must have an outside diameter of at least 20 nm, the structure must accommodate at least 60 nm in the lowest layer. The pitch at the patterned layer must be large enough to accommodate that result. Because the X pitch of the active pillar can be smaller in an elliptical or elongated pattern, because of reduced field enhancement, the X pitch can be smaller than in prior designs.

Of course the sizes can be increased or decreased as suits the needs of a particular implementation.

Figure 13:
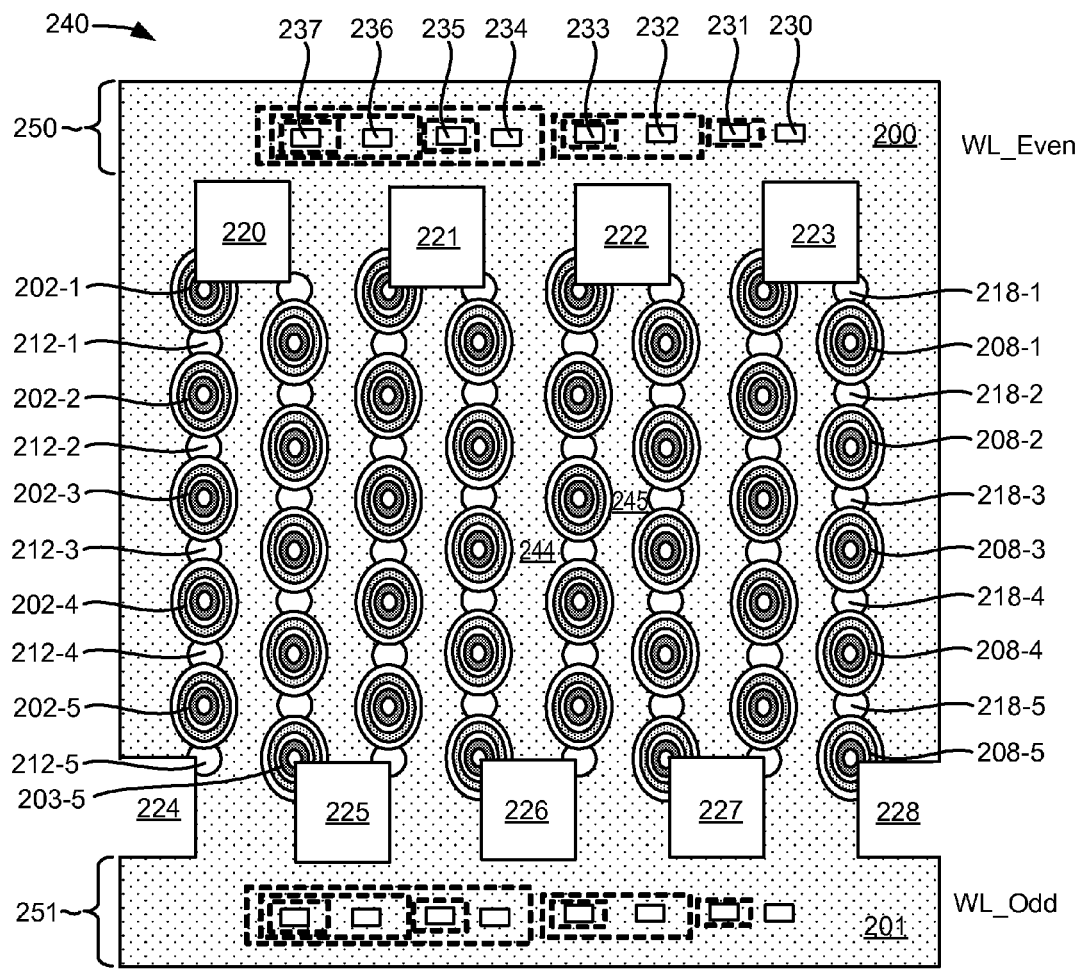
FIG. 13 is a layout view of a word line layer illustrating an embodiment for even and odd word lines.

FIG. 13 shows a layout view of a word line layer for a block of memory cells, including the interlayer connector structure, and even and odd word line structures. As illustrated, an even word line structure 200 and an odd word line structure 201 have word line extensions into the array of active pillars that are interdigitated. The array of active pillars includes a plurality of rows which are offset in a honeycomb arrangement. A first row includes active pillars 202-1, 202-2, 202-3, 202-4, and 202-5. Isolation pillars 212-1 through 212-5 are disposed between the active pillars as illustrated. A first active pillar in a next row includes pillar 203-5. On the right side of the layout, another row of active pillars includes active pillars 208-1 through 208-5, which are separated by isolation pillars 218-1 through 218-5. The even word line structure 200 is separated from the odd word line structure 201 by cutouts 220, 221, 222 and 223. Likewise, the odd word line structure 201 is separated from the even word line structure 200 by the cutouts 224 through 228. As a result, word lines extend between the rows of active pillars, so that for each row, there is an even word line (e.g. word line 244 terminating at cutout 226), and an odd word line (e.g. 245 terminating at cutout 222), adjacent opposing sides of each active pillar.

The active pillars at the end of each row (e.g. active pillar 202-1 and active pillar 203-5), may not be utilized in the memory operation, but are formed nonetheless as part of the process for separating the even and odd word lines.

The even word line structure 200 includes a landing pad area 265. Likewise, the odd word line structure 201 includes a landing pad area 266. Stairstep contact structures 240, 241 are used to access the individual layers. Referring to the stairstep contact structure 240 on the even word line structure 200, eight interlayer contacts 230 through 237 are formed, which contact landing pad areas on each of eight word line layers in this example. Interlayer contact 230 lands on the pad area 265 of the even word line structure 200 on the top layer. Interlayer contact 231 lands on the pad area of the even word line structure second from the top and so on, so that interlayer contact 237 lands on the even word line structure in the layer eighth from the top. These interlayer contacts can be disposed in vias as represented in the diagram, where the large dashed rectangle which encompasses word line contacts 234 through 237 is opened through four layers. The intermediate sized dashed rectangles, which enclose word line contacts 236 and 237 and contacts 232 and 233, open through two layers each. The smaller dashed rectangles, which enclose word line contacts 231, 233, 235 and 237, open through one layer each. Of course other arrangements for interlayer contacts among the word line layers can be utilized.

Figure 14:
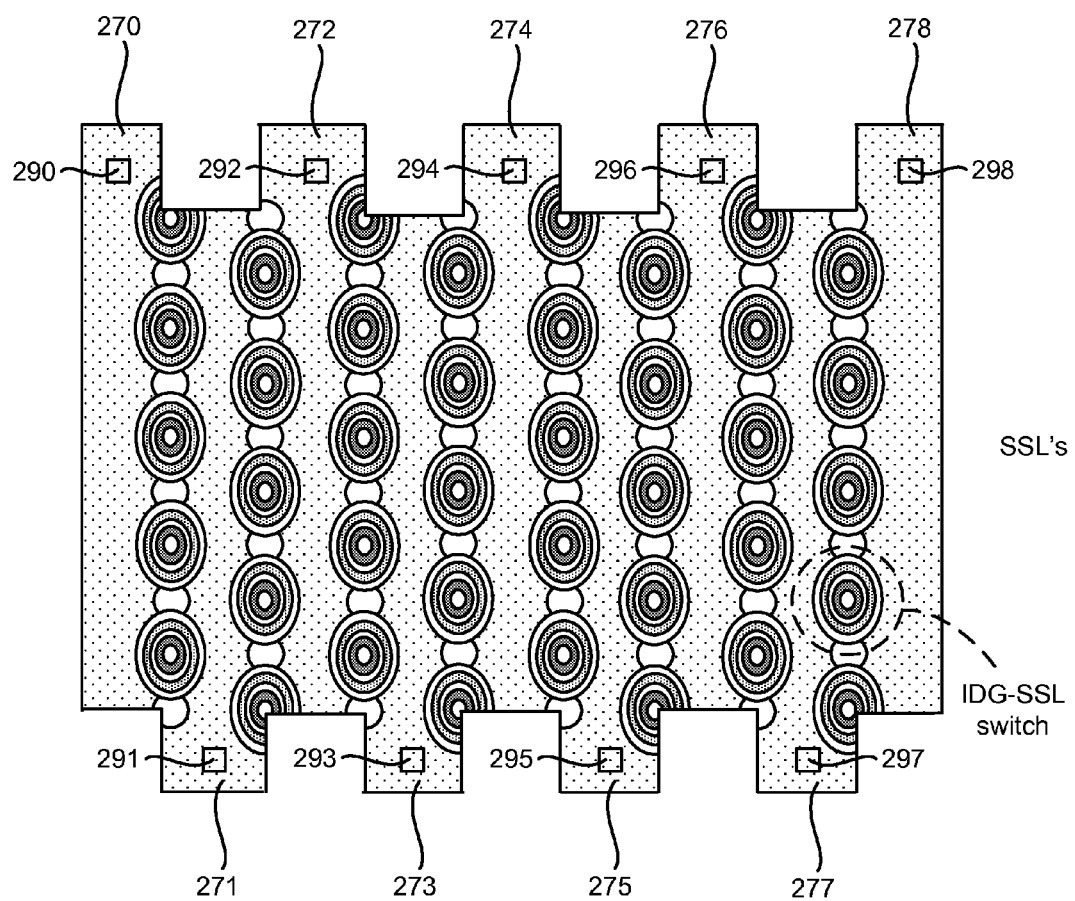
FIG. 14 is a layout view of a string select line layer, illustrating an embodiment for independent double gate SSL switches.

FIG. 14 shows a layout view of a string select line layer on top of the word line layers in a block of the memory array. The structures are formed by making a cut through an uppermost word line layer having the pattern shown in FIG. 13, along the line through the cutouts 220-223 and 224-228. This pattern results in formation of independent string select lines 270, 271, 272, 273, 274, . . . 278, between each row of active pillars. Interlayer contacts can be placed at the locations 290-298 on the even side, and 291-297 on the odd side of the structure. These interlayer contacts allow for making connection to overlying string select line structures as illustrated below.

The formation of the string select line layer as shown in FIG. 14 results in formation of independent double gate string select line switches, formed by the combination of an upper frustum of the active pillar and the adjacent independent string select lines, for each of the active columns in the array.

Figure 15:
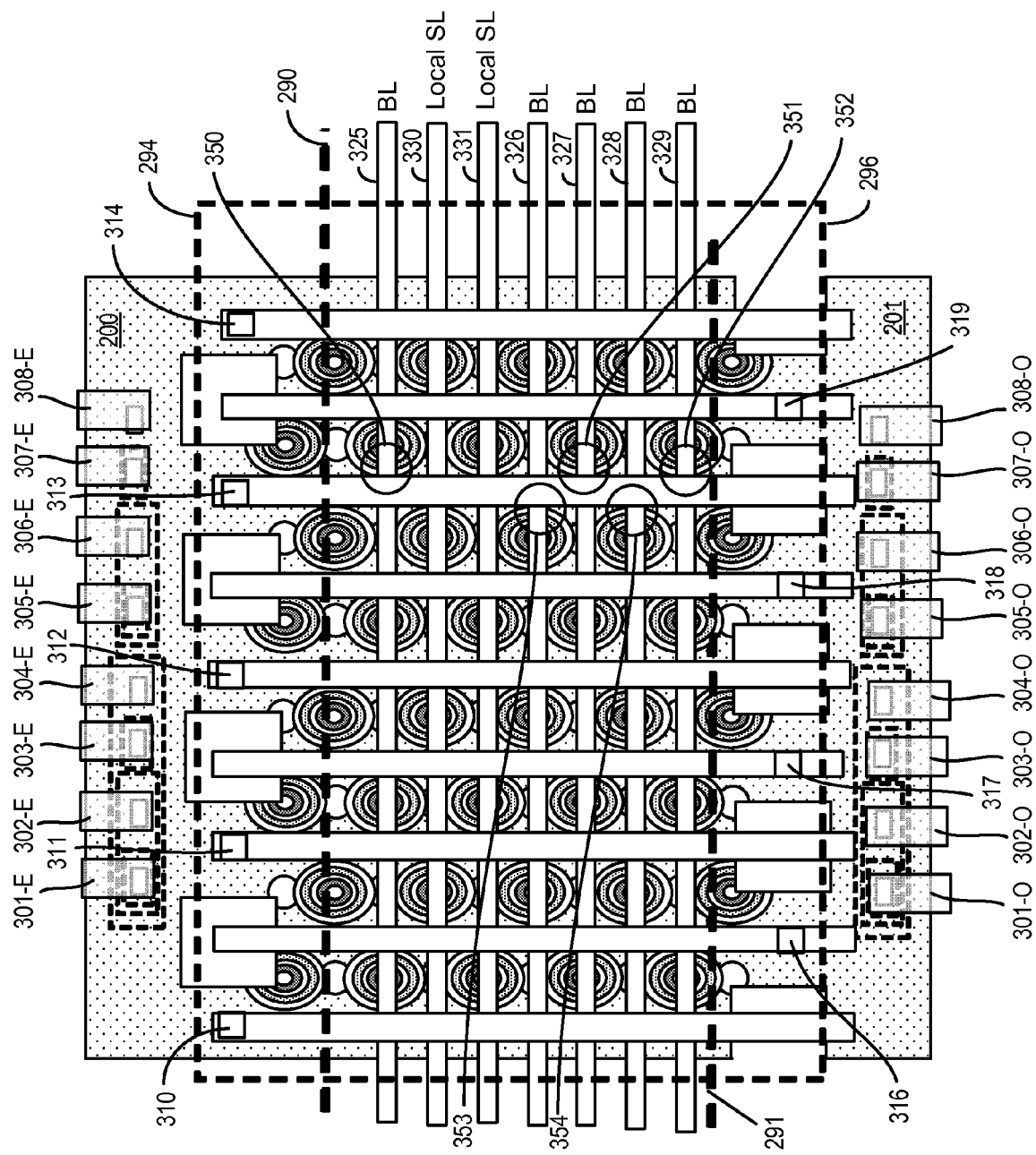
FIG. 15 illustrates a memory block as described herein.

FIG. 15 illustrates the layout of overlying patterned conductor layers, such as metal layers, which act as global bit lines, string select lines and word lines coupled to a block of the three-dimensional memory. The active array is disposed between the dashed lines 290 and 291 with unused active pillars on each end. The independent double gate string select cut is made on lines 294 and 296 resulting in a structure as shown in FIG. 14 on top of the block. The interlayer conductors on the stairstep conductor regions 240 and 241 of FIG. 13 are coupled to patterned word lines 301-E through 308-E on the even side, and 301-0 through 308-0 on the odd side. Likewise, overlying conductor lines configured as global bit lines, such as metal lines, are arranged in a tight pitch due to the honeycomb pattern of the active pillars. Thus conductor line 325 is disposed along one array column, conductor line 330 is disposed on an adjacent but offset column of the array. Conductor lines 331, 326, 327, 328 and 329 are disposed along respective columns of active pillars that are utilized in the memory.

In architectures using the source line conductor structure described in FIG. 11C, some of the active pillars can be dedicated as electrical local source lines coupled to other source lines in a single row by the source line conductor structure. The active pillars dedicated as electrical local source lines are maintained in the low threshold, or erased, state. In this embodiment, where the source line conductor structure provides for a U-shaped path, at least one of the columns of active pillars is used as a local source line. In this example, conductor line 330 and conductor line 331 are utilized as local source lines, so that each of the rows of active pillars includes at least one local source line. The number of local source lines implemented in this manner depends on the conductance of the structures and other factors. In one example, there can be at least one local source line for every four active pillars in a row.

A selected page (bits readable in parallel on global bit lines that can be coupled to a page buffer) is controlled by the two independent double-gate string select line switches and their corresponding even and odd string select lines (SSL(i) and SSL(i+1)). The string select lines are couple to overlying patterned conductor lines at contacts 310-314 on even side, and contacts 316-319 on the odd side. The unselected independent double gate string select line switches that are immediately adjacent opposing sides of the two selected SSL switches, can be turned off by applying a relatively high magnitude, negative voltage to the adjacent string select lines, sufficient to deplete the vertical channel structure in the active columns on the adjacent row, and thereby turn off the unselected strings. The other SSL lines (far side lines) can be set to an off voltage, such as about −0.5 V.

Using the conductor structures and block architecture shown in FIG. 15, a read bias arrangement can be understood for reading the even side 350, 351, 352 of a row of cells on a selected word line layer. According to the addressing scheme, a word line layer and an even or odd word line structure are selected using one of the word line conductors 301-E through 308-E, or 301-0 through 308-0. A page is selected by the combination of the set of global bit lines coupled to the selected block and contacting the selected side of the active pillars, and the specific row selected by the string select lines on both sides of the active pillars of the selected row.

Table 1 illustrates a representative read bias arrangement.

TABLE 1

READ BIAS

| | |
|---|---|
| SELECTED WL(N)_even: | Vread (set for threshold states) |
| OPPOSITE SIDE WL(N)_odd | Vinhibit (e.g. −3.3 V) |
| OTHER WLs: (other layers, even and odd) | Vpass, read (e.g. +6 to +7 V) |
| GSL: | Vpass, read (e.g. +6 to +7 V) |
| SELECTED BLs: (e.g. 325, 327, 329) | Vsense (e.g. +1 V) |
| UNSELECTED BLs: (e.g. 326, 328) | Vref (e.g. 0 V) |
| Local SLs: (e.g. 330, 331) | Vref (e.g. 0 V) |
| SELECTED SSL(i): (e.g. 313) | Von (e.g. +2.5 V) |
| SELECTED SSL(i + 1): (e.g. 319) | Von (e.g. +2.5 V) |
| ADJACENT SSL(i − 1): | Vdeplete (e.g. −5 to −8 V) |
| ADJACENT SSL(i + 2): | Vdeplete (e.g. −5 to −8 V) |
| FAR SSLs: | Voff (e.g. −0.5 V) |

Note that for each page, only half of the global bit lines are utilized. To sense the data in the other half of the global bit lines, the two adjacent pages on the same word line must be accessed sequentially using this bias arrangement. Since the even/odd word lines each contact one side of two the active pillars, the read method illustrated reads only the stored charge on one side of the selected word lines. In this way, each side of the cell in a selected active column can be accessed separately, establishing two charge storage sites per cell at each frustum of each pillar. Each of the two charge storage sites can store one bit per cell in some embodiments. In other embodiments, each of the two charge stored sites per cell can store more than one bit, such as two bits per side. In this manner, the cell at each frustum of each pillar stores four or more bits of data. This can result in a very high density memory array.

By opening two pages together, e.g. the page selected by SSL(i) and SSL(i+1) and the page selected by SSL(i) and SSL(i−1), all the global bit lines 325, 326, 327, 328, 329 can be used in parallel using a burst read bias such as illustrated in Table 2, to read the even word line side 350-352 of cells on one side (left side in this illustration) of a first row of active pillars, and the even word line side 353, 354 of cells on one side (right side in this illustration) of the active pillars in an adjacent row.

TABLE 2

BURST READ BIAS

| | |
|---|---|
| SELECTED WL(N)_even(i): | Vread (set for threshold states) |
| 2 × OPPOSITE SIDE WL(N)_odd (i − 1) and (i + 1): | Vinhibit (e.g. −3.3 V) |
| OTHER WLs: (other layers, even and odd) | Vpass, read (e.g. +6 to +7 V) |
| GSL: | Vpass, read (e.g. +6 to +7 V) |
| SELECTED BLs: (e.g. 325, 326, 327, 328, 329) | Vsense (e.g. +1 V) |

TABLE 2-continued

BURST READ BIAS

| | |
|---|---|
| Local SLs: (e.g. 330, 331) | Vref (e.g. 0 V) |
| SELECTED SSL(i): (e.g. 313) | Von (e.g. +2.5 V) |
| SELECTED SSL(i − 1): (e.g. 318) | Von (e.g. +2.5 V) |
| SELECTED SSL(i + 1): (e.g. 319) | Von (e.g. +2.5 V) |
| ADJACENT SSL(i − 2): | Vsuppress (e.g. −5 to −8 V) |
| ADJACENT SSL(i + 2): | Vsuppress (e.g. −5 to −8 V) |
| FAR SSLs: | Voff (e.g. −0.5 V) |

Table 3 illustrates a representative program bias arrangement. The array with this architecture can be biased to program only one side of each active pillar at a time. This enables the use of both sides of each active pillar at each layer to store data, with either one bit per side or multiple bits per side depending on the desired implementation, and the programming algorithm utilized. In one example, the programming algorithm can be an incremental step pulsed programming sequence ISPP, with increasing pulse height and program verify steps being executed until desired threshold levels are satisfied.

In other systems, a single pass, multilevel program operation can be applied, such as described in co-pending and commonly owned U.S. patent application Ser. No. 14/153,934, entitled PROGRAMMING MULTIBIT MEMORY CELLS; by Hsieh et al., filed on 13 Jan. 2014; which application is incorporated by reference as if fully set forth herein. One example process executed by the controller to operate a multiple bits per cell memory, comprises storing a data set for programming a plurality of multi-level memory cells, the data set indicating one of a plurality of program states or an inhibit state for each memory cell in the plurality, where the plurality of program states correspond to a corresponding plurality of target program levels for the multi-level memory cells. For the data set, the method includes executing a plurality of program cycles for the plurality of multi-level memory cells, wherein a program cycle in the plurality of program cycles includes applying a program bias to multi-level memory cells in the plurality of program states, and after applying the program bias applying program verify steps for more than one of the plurality of program levels to change the data set program states to the inhibit state for the multi-level memory cells in the plurality which pass verify at the indicated target program level. The data set can be applied in each cycle in the one-pass, multiple-level operation to determine inhibit and program states for the selected cells.

TABLE 3

PROGRAM BIAS

| | |
|---|---|
| SELECTED WL(N)_even: | Vprog (ISPP, e.g. 18 to 22 V) |
| OPPOSITE SIDE WL(N)_odd | Vpass, pgm (e.g. +10 V) |
| OTHER WLs: (other layers, even and odd) | Vpass, pgm (e.g. +10 V) |
| GSL: | Vpass, pgm (e.g. +10 V) |
| SELECTED BLs: (e.g. 325, 327, 329) | Vsense (e.g. 0 V) |
| UNSELECTED BLs: (e.g. 326, 328) | Vref (e.g. 3.3 V) |
| Local SLs: (e.g. 330, 331) | Vref (e.g. 3.3 V) |
| SELECTED SSL(i): (e.g. 313) | Von (e.g. +2.5 V) |
| SELECTED SSL(i + 1): (e.g. 319) | Von (e.g. +2.5 V) |
| ADJACENT SSL(i − 1): | Vsuppress (e.g. −5 to −8 V) |
| ADJACENT SSL(i + 2): | Vsuppress (e.g. −5 to −8 V) |
| FAR SSLs: | Voff (e.g. −0.5 V) |

Table 4 illustrates a representative erase bias arrangement. A block erase bias can be applied in a periodic array that includes a plurality of cell blocks such as that illustrated in FIG. 15.

TABLE 4

ERASE BIAS

| | |
|---|---|
| ALL WLs selected block: | Vref (e.g. 0 V) |
| ALL WLs unselected blocks: | Floating |
| ALL BLs: (e.g. 325, 327, 329) | Verase(e.g. +20 V) |
| ALL Local SLs: (e.g. 330, 331) | Verase (e.g. +20 V) |
| ALL SSLs: | Vgidl (e.g. +6 V) |

Figure 16:
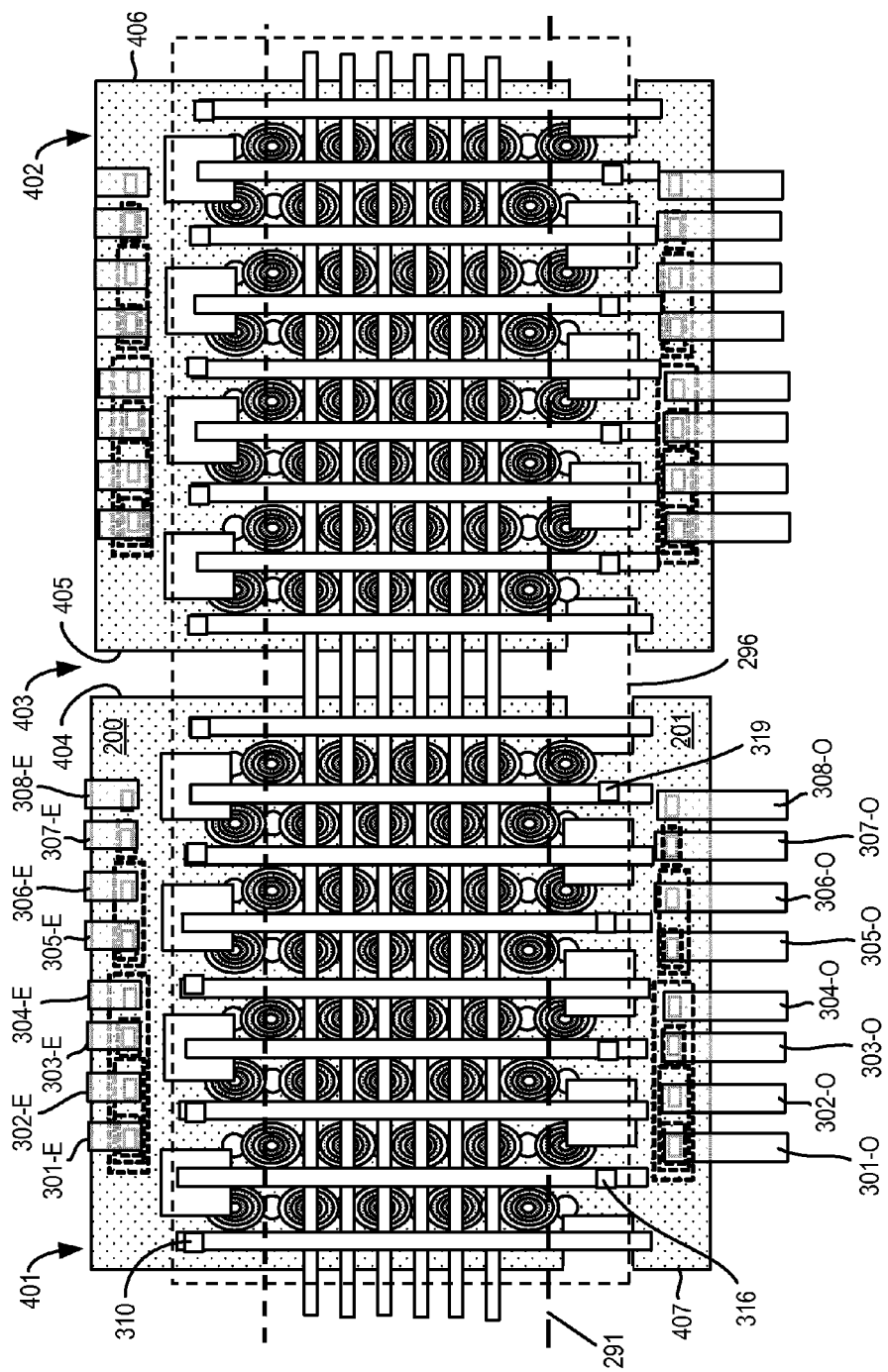
FIG. 16 is a multi-block layout illustration of a memory device as described herein.

FIG. 16 shows a layout embodiment for multiple blocks having the structure shown in FIG. 15. Reference numerals applied in FIG. 15 are used in FIG. 16 as well.

In FIG. 16, a first block 401 and a second block 402 are illustrated, and laid out along the array column direction, or the bit line direction. Thus, the global bit lines overlying block 401 are shared with block 402, and so on along the global bit lines. The number of blocks shared along a single set of global bit lines can be determined based on array characteristics.

The blocks are separated by forming an isolation region 403 between the word line layers. Also, in order to improve conductivity on the even and odd word line structures, the sides 404, 405, 406, 407 of the word line structures can be coated with a conductive material such as a silicide. A silicide can be formed using a self-aligned process known as SAlicide.

In this layout, the global bit lines can be implemented using a first metal layer of patterned conductors which extends to a page buffer shared by the blocks along the global bit lines. The word lines can also be implemented using the first metal layer of patterned conductors, which connect the even word line layers to even word line decoders, and the odd word line layers to odd word line decoders.

String select lines SSL can be implemented using a second metal layer overlying the first metal layer, to connect the SSL lines to string select decoders.

In other embodiments, other combinations of overlying patterned conductor layers can be used for interconnecting the blocks of memory cells.

Figure 17:
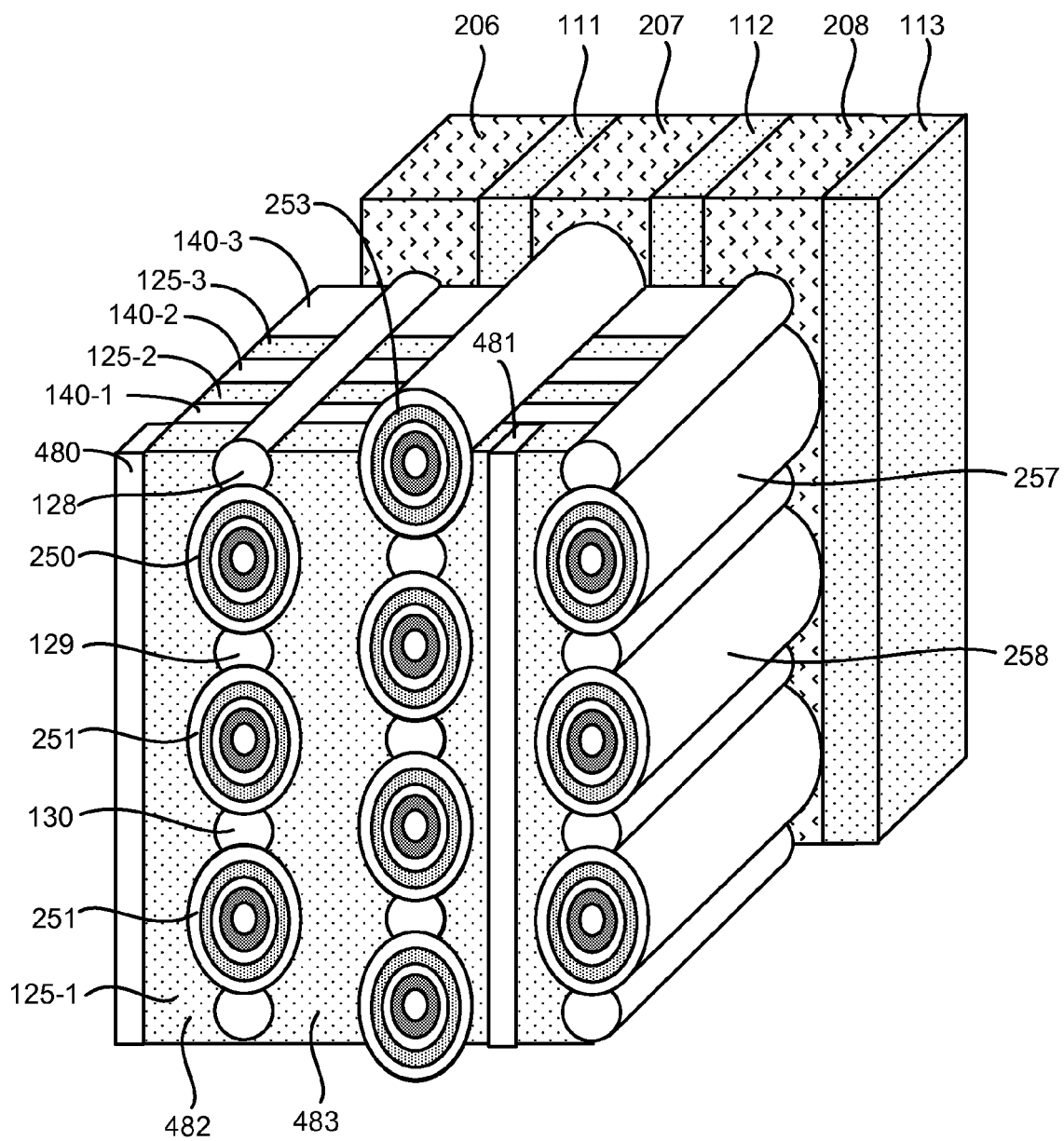
FIG. 17 illustrates a perspective view of an alternative implementation showing a double gate string select line structure.

FIG. 17 illustrates an alternative structure, in which the string select lines are implemented as double gate lines, instead of as independent double gate lines. In this example, the string select line layer of the word line material has a relaxed pitch, allowing space for isolation cuts 480, 481 in the SSL layer between pairs of rows of active pillars. The string select lines extend to a contact area 482 on one end of each row, with an interlayer contact 483 providing for a connection to an overlying patterned conductor line. The double gate string select line structure can simplify the decoding process for some operating modes of the memory device.

Figure 18:
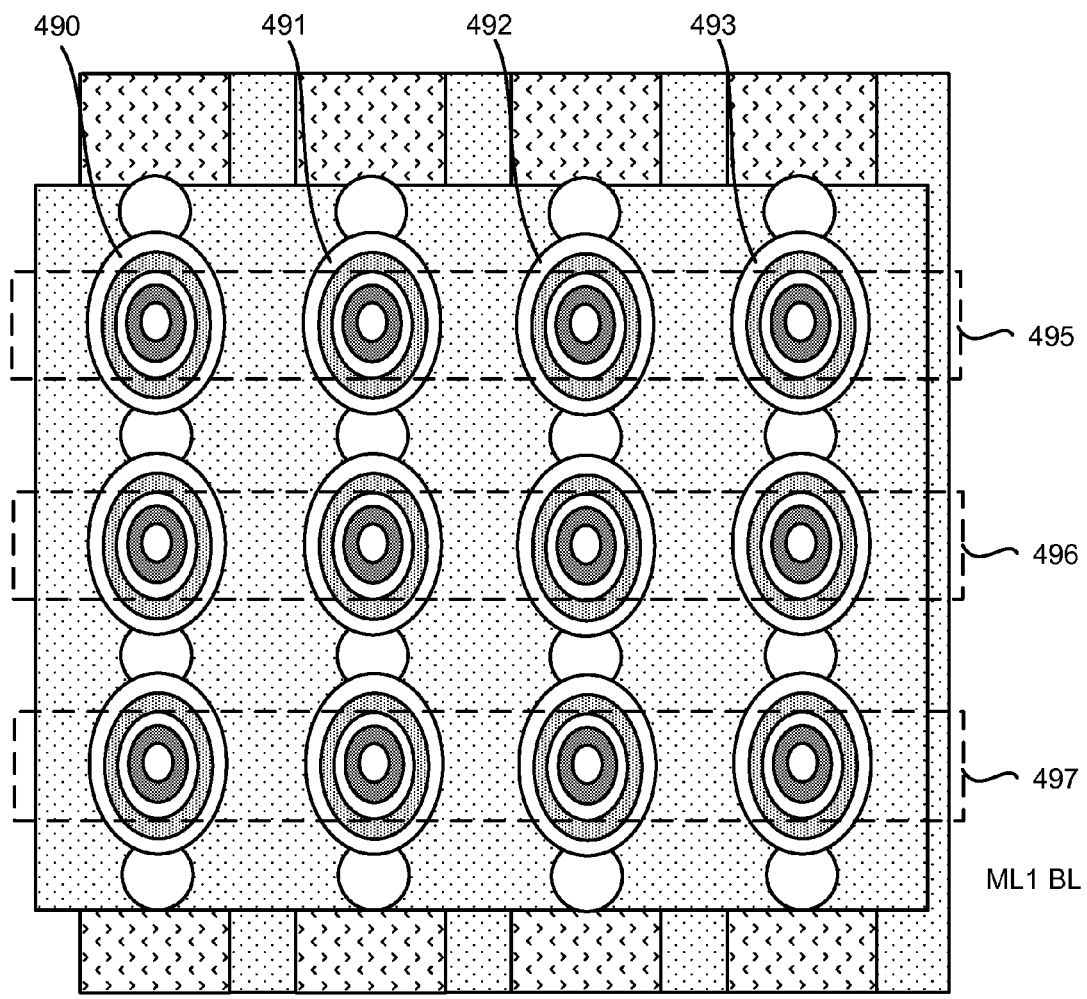
FIG. 18 illustrates an alternative layout view for a 3D block as described herein.

FIG. 18 illustrates yet another alternative for the array layout, in which the active pillars are laid out in a "square" arrangement as opposed to a "twisted" or "honeycomb" arrangement. Thus, the active pillar (e.g. 490) in the first column along a row is aligned in the array column direction with the active pillars in each row (e.g. 491, 492, 493) along the column. The overlying metal bit lines 495, 496, 497 contact an active pillar in each row, rather than in every other row as illustrated in the honeycomb layout. While this square layout is less complicated, it comes at the cost of greater bit line pitch, and less density.

Figure 19:
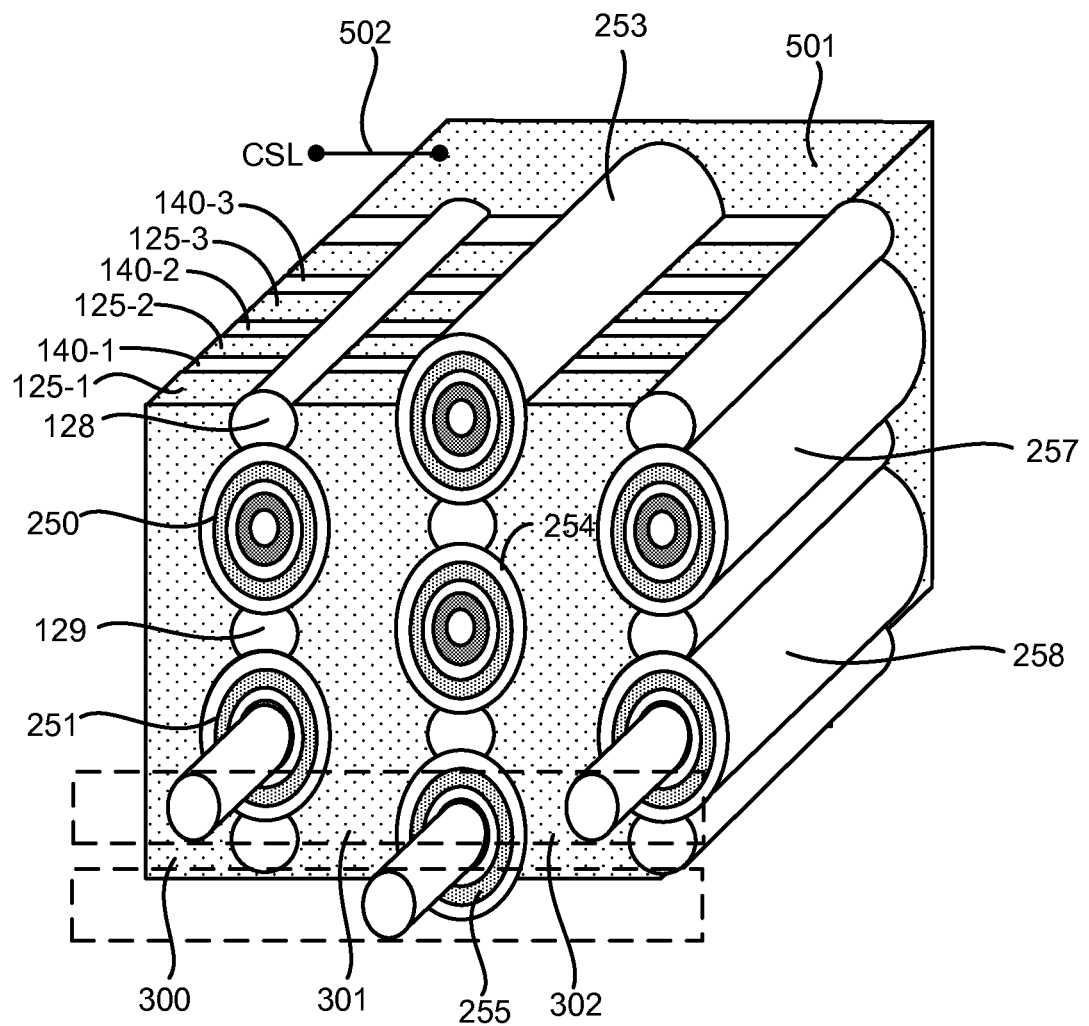
FIG. 19 illustrates an alternative implementation with a substrate source line for a 3D array as described herein.

FIG. 19 illustrates an alternative source line conductor structure, compared to that discussed above with respect to FIG. 11B. Reference numerals from FIG. 11B are used again where appropriate. In this example, a doped polysilicon or other conductive layer 501 (isolated from the substrate) is disposed at the bottom of the array of active pillars as a common source line CSL. An interlayer contact (schematically 502) is disposed on the array, such as between each block, or in a pattern around the blocks, for connecting the doped conductor region 501 to a source side reference voltage circuit or a bias voltage circuit for the common source line CSL.

Figure 20:
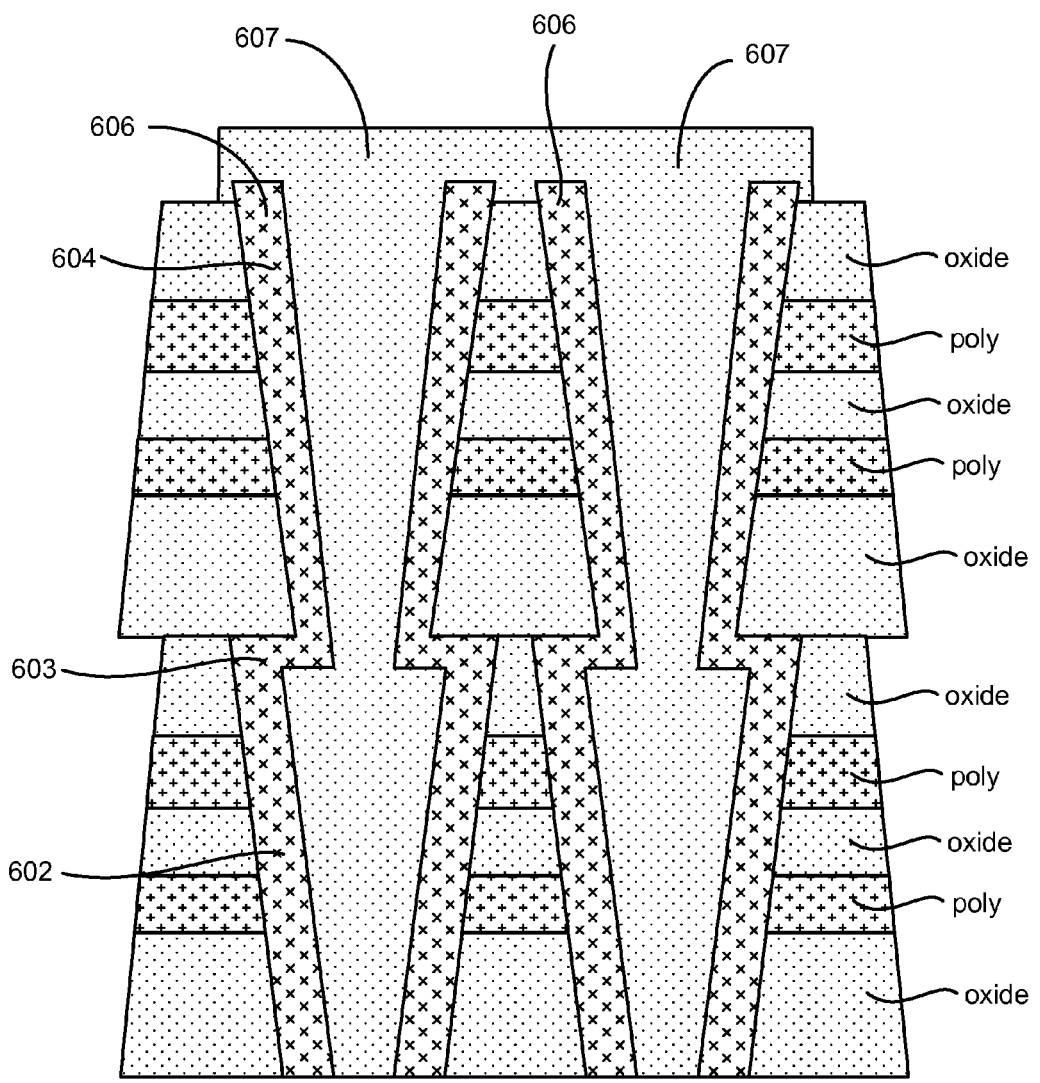
FIG. 20 illustrates a structure having an increased number of word line layers, for a vertical channel NAND structure.

FIG. 20 illustrates a technique for increasing the density of a block of memory cells, by increasing the number of word line layers. Because the etching processes have a slight taper angle, less than about 89.5°, for a structure with a large number of word line layers, the dimension of the hole at the bottom layer may be significantly less than that at the top layer, limiting the pitch of the array for a large stack. Also, mechanical bending of the structures can be another limiting factor to the depth of the etch. Thus, in the embodiment represented by FIG. 20, the hole etch process for at least the active pillars, and also for the isolation pillars if desired, can be divided into more than one etch step. The process involves forming a first stack of word line layers (there can be many more than the two in the illustration) separated by isolation layers, etching the word line layer patterns, including holes for the isolation material and for the active pillars. Next, the stack is planarized, and a second stack of word line layers is formed over the structure. Then the word line layer patterns are etched in the second stack in registration with the pattern applied in the first stack. As a result, the holes for the active pillars have a lower portion with a tapered wall 602, a transition region 603 between the lower portion in the upper portion, and an upper portion with a tapered wall 604. Then, after formation of the holes for the active pillars, the dielectric charge trapping layers are deposited followed by deposition of the material for the vertical channel structures. The dielectric charge trapping layers 606 and vertical channel structures 607 should be deposited after patterning of the upper stack, in order to guarantee that they are electrically connected.

Figure 21:
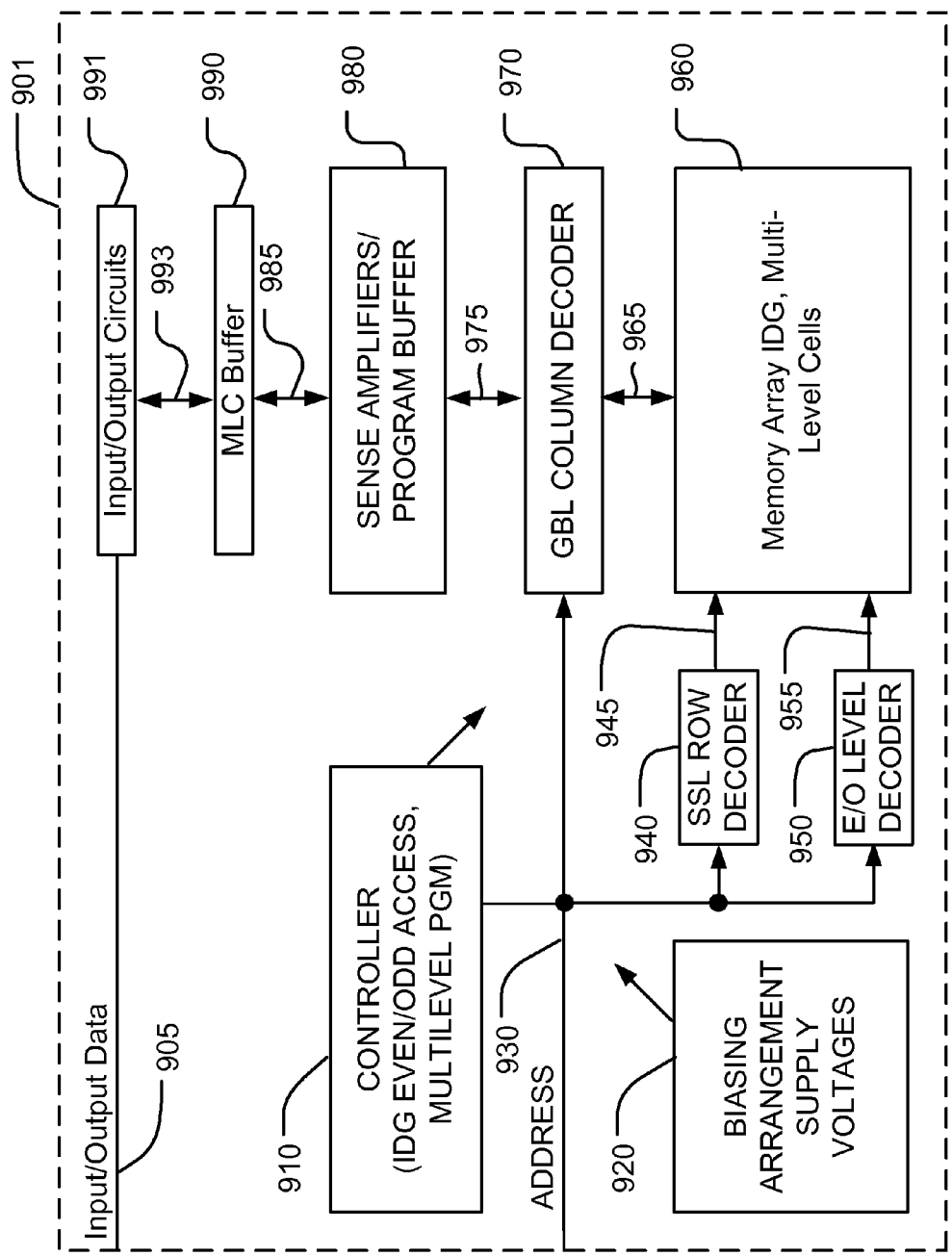
FIG. 21 is a simplified block diagram of an integrated circuit memory having an independent double gate vertical channel memory array, with multibit-per-side-of-the-cell programming technologies.

FIG. 21 is a simplified chip block diagram of an integrated circuit 901 including a 3D, independent double gate, vertical channel NAND array. The integrated circuit 901 includes a memory array 960 including one or more memory blocks as described herein with independent double gate, vertical channel cells, having multiple bits per cell on an integrated circuit substrate.

An SSL decoder 940 is coupled to a plurality of SSL lines 945, arranged in the memory array 960. An even/odd level decoder 950 is coupled to a plurality of even/odd word lines 955. A global bit line column decoder 970 is coupled to a plurality of global bit lines 965 arranged along columns in the memory array 960 for reading data from and writing data to the memory array 960. Addresses are supplied on bus 930 from control logic 910 to decoder 970, decoder 940 and decoder 950. Sense amplifier and program buffer circuits 980 are coupled to the column decoder 970, in this example via first data lines 975. The program buffer in circuits 980 can store program codes for multiple-level programming, or values that are a function of the program codes, to indicate program or inhibit states for selected bit lines. The column decoder 970 can include circuits for selectively applying program and inhibit voltages to bit lines in the memory in response to the data values in the program buffer.

Sensed data from the sense amplifier/program buffer circuits are supplied via second data lines 985 to multi-level data buffer 990, which is in turn coupled to input/output circuits 991 via a data path 993. Also, input data is applied in this example to the multi-level data buffer 990 for use in support of multiple-level program operations for each of the independent sides of the independent double gate cells in the array.

Input/output circuits 991 drive the data to destinations external to the integrated circuit 901. Input/output data and control signals are moved via data bus 905 between the input/output circuits 991, the control logic 910 and input/output ports on the integrated circuit 901 or other data sources internal or external to the integrated circuit 901, such as a general purpose processor or special purpose application circuitry, or a combination of modules providing system-on-a-chip functionality supported by the memory array 960.

In the example shown in FIG. 21, control logic 910, using a bias arrangement state machine, controls the application of supply voltages generated or provided through the voltage supply or supplies in block 920, such as read, erase, verify and program bias voltages. The control logic 910 is coupled to the multi-level buffer 990 and the memory array 960. The control logic 910 includes logic to control multiple-level program operations. In embodiments supporting the independent double gate vertical NAND structures described herein, the logic is configured to perform the method of:

selecting a layer of memory cells in the array, such as using a word line layer decoder;

selecting a side of the vertical channel structures in the selected layer such as by selecting an even or odd side word line structure;

selecting vertical channel structures in a selected row in the array such as by using SSL switches on the rows of vertical channel structures; and storing charge in charge trapping sites in the selected layer on the selected side of vertical channel structures in one or more selected columns in the array, to represent data using bit line circuitry like page buffers on global bit lines coupled to the selected row of vertical channel structures.

In some embodiments, the logic is configured to select a layer and select a side by selecting one of even and odd interdigitated word line structures in the selected layer of the array, such as by controlling even and odd word line layer decoders.

In some embodiments, the logic is configured to store multiple levels of charge to represent more than one bit of data in the charge trapping sites in the selected layer on the selected side. In this manner, so that a selected cell in a selected frustum of a vertical channel structure in the array stores more than two bits, including more than one bit on each side of the cell.

The control logic 910 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

The memory array 960 can comprise charge trapping memory cells configured to store multiple bits per cell, by the establishment of multiple program levels that correspond to amounts of charge stored, which in turn establish memory cell threshold voltages $V_T$.

Figure 22:
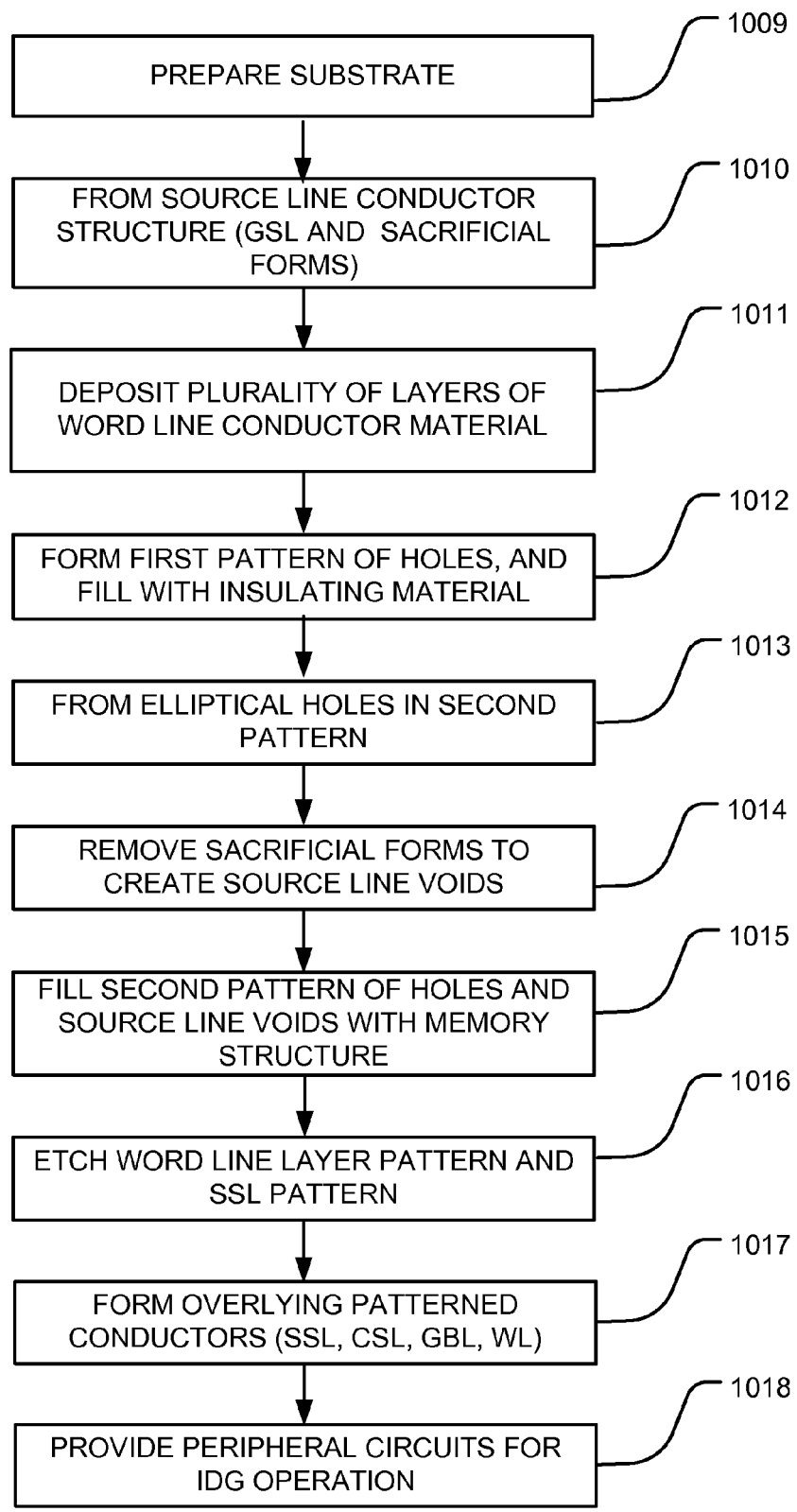
FIG. 22 is a simplified flow diagram of a manufacturing process is described herein.

FIG. 22 is a flow chart illustrating a method for manufacturing a memory device. The method includes identifying areas on a substrate for formation of 3D memory blocks having a structure like that of FIG. 15. The flowchart begins with preparing a substrate for formation of the three-dimensional vertical channel NAND array (1009). This process can include forming an insulating layer over a semiconductor substrate, or other isolation structure, in the region of the memory array. A source line conductor structure is then formed on the prepared substrate (1010). This process can include steps discussed above in connection with FIGS. 6 and 7, in which a pattern of ground select lines and sacrificial forms are formed in rows in the memory array area.

A plurality of layers of word line conductor material is then formed over the source line conductor structure (1011). The layers of word line conductor material are separated by layers of insulating material, and are used for formation of the word line conductor structures and string select line conductor structures. A first pattern of holes is etched through the stack of layers of word line conductor materials, and then the holes are filled with insulating material to form the insulating pillars utilized in the array, as shown in FIGS. 8A-8B (1012). A second pattern of holes is etched through the stack of layers of word line conductor materials, in the matter illustrated in FIGS. 9A-9B (1013).

Then, the sacrificial forms beneath the second pattern of holes are removed as illustrated in FIG. 10, to form source line voids (1014). The process then includes filling the holes in the second pattern, and the source line voids with memory structure and materials, including a dielectric charge trapping structure and vertical channel structure as illustrated in FIGS. 11A-11C (1015). The process also includes etching the word line layer pattern in the plurality of layers of word line conductor material, and etching a top layer of word line conductor material according to a string select line pattern, such as the patterns illustrated in FIGS. 13 and 14, respectively (1016). Connections can be made to the ground select line structure using interlayer connectors, adjacent to each block of the memory array.

Overlying patterned conductors are formed over the memory area on the substrate, including global bit lines, common source lines, word lines, and string select lines using one or more patterned conductor layers as shown in FIG. 12 (1017). Also, peripheral circuits are provided on the substrate, typically outside of the memory area, which include bit line circuitry, word line circuitry, page buffers, sense amplifiers and the like (1018). Back-end-of-line operations are completed to form a packaged integrated circuit.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
a plurality of word line layers, a word line layer in the plurality including a first word line structure comprising a first landing pad element and a plurality of even word lines extending away from the first landing pad element, and a second word line structure comprising a second landing pad element and a plurality of odd word lines extending away from the second landing pad element and interdigitated with the plurality of even word lines;
a plurality of rows of active pillars and insulating pillars extending through the plurality of word line layers, the rows in the plurality disposed between corresponding even word lines and odd word lines, the active pillars in a row in the plurality rows comprising respectively a vertical channel structure, a charge storage layer and an outside insulating layer; the insulating pillars in the row separating the even and odd word lines between the active pillars; and
in frustums of the active pillars in the plurality of word line layers, the outside insulating layers of the active pillars contacting a first arcuate edge of an even word line and a second arcuate edge of an odd word line.

2. The memory device of claim 1, wherein a cross section of the active pillars in the at least one frustum is generally elliptical with a major axis generally parallel with the first and second conductive strips.

3. The memory device of claim 2, wherein the major axis of the elliptical cross section is substantially longer than the minor axis.

4. The memory device of claim 1, wherein a cross section of the active pillar in a frustum is arranged so that an average radius of curvature of the first and second arcuate edges is greater than an average radius of curvature of the frustum adjacent the insulating column at the same layer.

5. The memory device of claim 1, including:
global bit lines over the plurality of word line layers connecting respective columns of active pillars in the plurality of rows to a page buffer.

6. The memory device of claim 1, including:
string select switches at top frustums of the active pillars.

7. The memory device of claim 1, including:
source line conductor structures beneath the plurality of rows of active pillars; and
wherein at least one active pillar in each row is connected to the source line conductor structure beneath the row, and to a source line over the plurality of word line layers.

8. The memory device of claim 1, further comprising:
word line driver circuits configured for independent biasing of the first and second word line structures in the plurality of layers.

9. The memory device of claim 1, wherein the vertical channel structure has a central seam.

* * * * *